United States Patent
Stoll et al.

(10) Patent No.: US 11,447,695 B2
(45) Date of Patent: Sep. 20, 2022

(54) LIGHTING DEVICE AND USE OF LIGHTING DEVICE

(71) Applicant: Osram OLED GmbH, Regensburg (DE)

(72) Inventors: Ion Stoll, Tegernheim (DE); Philipp Pust, Langquaid (DE)

(73) Assignee: OSRAM OLED GMBH, Regensburg (DE)

( * ) Notice: Subject to any disclaimer, the term of this patent is extended or adjusted under 35 U.S.C. 154(b) by 171 days.

(21) Appl. No.: 16/762,511

(22) PCT Filed: Oct. 23, 2018

(86) PCT No.: PCT/EP2018/078984
§ 371 (c)(1),
(2) Date: May 8, 2020

(87) PCT Pub. No.: WO2019/091774
PCT Pub. Date: May 16, 2019

(65) Prior Publication Data
US 2020/0347293 A1 Nov. 5, 2020

(30) Foreign Application Priority Data

Apr. 11, 2018 (DE) .................... 10 2018 205 464.9

(51) Int. Cl.
*H01L 33/50* (2010.01)
*C09K 11/08* (2006.01)
(Continued)

(52) U.S. Cl.
CPC .......... *C09K 11/0883* (2013.01); *C09K 11/64* (2013.01); *C09K 11/7734* (2013.01);
(Continued)

(58) Field of Classification Search
CPC . C09K 11/0883; C09K 11/64; C09K 11/7734; H01L 33/504
(Continued)

(56) References Cited

U.S. PATENT DOCUMENTS 9,028,716 B2  5/2015  Winkler et al.
9,157,025 B2  10/2015  Winkler et al.
(Continued)

FOREIGN PATENT DOCUMENTS

CN  101124295 A  2/2008
CN  104781369 A  7/2015
(Continued)

OTHER PUBLICATIONS

Pejchal, J et al., "Improvement of the growth of Li4SiO4 single crystals for neutron detection and their scintillation and luminescence properties", Journal of Crystal Growth, Feb. 12, 2016, pp. 143-150, 457, Elsevier, Amesterdam, Netherlands.
(Continued)

*Primary Examiner* — Christopher M Raabe
(74) *Attorney, Agent, or Firm* — Viering, Jentschura & Partner MBB

(57) ABSTRACT

A lighting device for emitting a red total radiation may be configured such that the lighting device has a semiconductor layer sequence configured to emit electromagnetic primary radiation. A conversion element may include a first fluorescent material of the formula $Sr[Al_2Li_2O_2N_2]$:Eu, crystallized in the tetragonal space group $P4_2/m$. The first fluorescent material may at least partially convert the electromagnetic primary radiation into an electromagnetic secondary radiation in the red region of the electromagnetic spectrum. The conversion element may include a second fluorescent material to at least partially convert the electromagnetic primary radiation into an electromagnetic second-
(Continued)

ary radiation in the red region of the electromagnetic spectrum and/or the lighting device may include a mirror or filter arranged above the conversion element.

15 Claims, 11 Drawing Sheets

(51) Int. Cl.
| | |
|---|---|
| F21V 9/40 | (2018.01) |
| C09K 11/64 | (2006.01) |
| C09K 11/77 | (2006.01) |
| H01L 33/44 | (2010.01) |
| H01L 33/60 | (2010.01) |

(52) U.S. Cl.
CPC .............. *F21V 9/40* (2018.02); *H01L 33/504* (2013.01); *H01L 33/44* (2013.01); *H01L 33/60* (2013.01)

(58) Field of Classification Search
USPC .......................................................... 257/98
See application file for complete search history.

(56) References Cited

U.S. PATENT DOCUMENTS

| | | |
|---|---|---|
| 10,479,936 B2 | 11/2019 | Seibald et al. |
| 10,505,080 B2 | 12/2019 | Seibald et al. |
| 10,644,206 B2 | 5/2020 | Seibald et al. |
| 10,711,192 B2 | 7/2020 | Seibald et al. |
| 2002/0190240 A1 | 12/2002 | Feldmann et al. |
| 2006/0244358 A1 | 11/2006 | Kim et al. |
| 2007/0166218 A1 | 7/2007 | Hirosaki et al. |
| 2008/0224596 A1 | 9/2008 | Park et al. |
| 2010/0155753 A1 | 6/2010 | Imanari et al. |
| 2012/0019126 A1 | 1/2012 | Porob et al. |
| 2012/0037941 A1 | 2/2012 | Schmidt et al. |
| 2013/0002167 A1 | 1/2013 | Van De Ven |
| 2013/0020533 A1 | 1/2013 | Fujinaga et al. |
| 2013/0093362 A1 | 4/2013 | Edwards |
| 2013/0127333 A1 | 5/2013 | Jia et al. |
| 2013/0140981 A1 | 6/2013 | Huber et al. |
| 2014/0049155 A1 | 2/2014 | Kurtin |
| 2014/0140055 A1 | 5/2014 | Chen et al. |
| 2014/0159584 A1 | 6/2014 | Grajcar |
| 2015/0109602 A1 | 4/2015 | Martin et al. |
| 2015/0123155 A1 | 5/2015 | Schmidt et al. |
| 2016/0043279 A1 | 2/2016 | Jean et al. |
| 2016/0049560 A1 | 2/2016 | Oh et al. |
| 2016/0312118 A1 | 10/2016 | Fiedler et al. |
| 2017/0040501 A1 | 2/2017 | Choi et al. |
| 2017/0186911 A1 | 6/2017 | Otto et al. |
| 2017/0186922 A1 | 6/2017 | Kim et al. |
| 2017/0250317 A1 | 8/2017 | Chen et al. |
| 2017/0294561 A1 | 10/2017 | Ikeda et al. |
| 2018/0127648 A1 | 5/2018 | Hirosaki |
| 2018/0148644 A1 | 5/2018 | Seibald et al. |
| 2018/0305613 A1 | 10/2018 | Bichler et al. |
| 2019/0093011 A1* | 3/2019 | Seibald .............. C09K 11/7734 |
| 2019/0144744 A1 | 5/2019 | Seibald et al. |
| 2019/0157520 A1* | 5/2019 | Seibald ................. H01L 33/504 |
| 2019/0191516 A1 | 6/2019 | Li et al. |
| 2019/0326481 A1* | 10/2019 | Seibald .............. C09K 11/0883 |
| 2020/0245428 A1 | 7/2020 | Baumann et al. |
| 2021/0184082 A1 | 6/2021 | Stoll et al. |

FOREIGN PATENT DOCUMENTS

| | | |
|---|---|---|
| DE | 202008018060 U1 | 5/2011 |
| DE | 112011102173 T5 | 3/2013 |
| DE | 102015107580 A1 | 11/2016 |
| DE | 102017205819 A1 | 10/2017 |
| DE | 102016121692 A1 | 2/2018 |
| EP | 2104149 A1 | 9/2009 |
| EP | 2428543 B1 | 5/2013 |
| EP | 2585554 B1 | 8/2016 |
| JP | 2006232906 A | 9/2006 |
| JP | 2006237113 A | 9/2006 |
| JP | 2009179662 A | 8/2009 |
| JP | 2012524141 A | 10/2012 |
| JP | 2015526532 A | 9/2015 |
| JP | 2018517806 A | 7/2018 |
| WO | 2009096082 A1 | 8/2009 |
| WO | 2012073177 A1 | 6/2012 |
| WO | 2013175336 A1 | 11/2013 |
| WO | 2016177890 A1 | 11/2016 |
| WO | 2018029299 A1 | 2/2018 |

OTHER PUBLICATIONS

Barth, J A et al., "Über Oxide des neuen Formeltyps A[T40 4]: Zur Kenntnis von KLi3Ge04, KLi3Si04 und KLi3 Ti04", Zeitschrift für anorganische und allgemeine Chemie, Jan. 1, 1984, pp. 7-22, Leipzig, Germany.

International search report issued for the corresponding PCT application No. PCT/EP2018/078984, dated Jan. 28, 2019, 14 pages (for informational purposes only).

German search report issued for the corresponding DE application No. 10 2018 205 464.9, dated Feb. 8, 2019, 7 pages (for informational purposes only).

International search report issued for the corresponding PCT application No. PCT/EP2017/078913, dated Feb. 22, 2018, 4 pages (for informational purposes only).

C. Weiss et al., "Das erste Titanat mit „Stuffed Pyrgoms": RbNa3Li12[Ti04]4=RbNa3Li8{Li[Ti04]}4, Zeitschrift fuer anorganische und allgemeine Chemie, 1994, pp. 2064-2069 (including 1 page English translation), vol. 620, Issue 12.

German Search Report based on 10 2016 121 692.5 (8 pages) dated Jun. 19, 2017 (for reference purpose only).

International Search Report based on PCT/EP2017/070329 (3 pages) dated Nov. 10, 2017 (for reference purpose only).

J. Hofmann et al., "Neue Silicate mit „Stuffed Pyrgoms": CsKNaLi9{Li[Si04]}4, CsKNa2Li8{Li[Si04]}4, RbNa3Li8{Li[Si04]>4, und RbNaLi4{Li[Si04]}4, Zeitschrift fuer anorganische und allgemeine Chemie, 1994, pp. 1495-1508 (including 1 page English translation), vol. 620, Issue 9.

K. Bernet et al., "Ein Lithosilicat" mit Kolumnareinheiten: RbLi{Li[SiO, Zeitschrift fuer anorganische und allgemeine Chemie, 1991, pp. 93-105 (including 1 page English translation), vol. 592, Issue 1.

Robert J. Lucas et al., "Measuring and using light in the melanopsin age", Trends in Neurosciences, Jan. 2014, 9 pages, vol. 37, No. 1, Elsevier.

B. Nowitzki et al., "Neues über Oxide vom Typ A [(TO)n] [1]: NaLi3SiO4, NaLi3GeO4 und NaLi3TiO4 [2]", Revue de Chimie minérale, 1986, pp. 217-230, Gauthier-Villars.

Philipp Pust et al., "Narrow-Band Red-Emitting Sr[LiAl3N4]:Eu2+ as a Next-Generation LED-Phosphor Material", Nature Materials, Jun. 22, 2014, 6 pages, Macmillan Publishers Limited.

Philipp Pust et al., "Ca[LiAl N :Eu2+—A Narrow-Band Red-Emitting Nitridolithoaluminate", Chemistry of Materials, May 9, 2014, 7 pages, vol. 26, American Chemical Society Publications.

R.Brandes et al., "Das erste Oxogermanat mit „Stuffed Pyrgoms: CsNa3Lis8{Li[Ge04]}4", Zeitschrift fuer anorganische und allgemeine Chemie, May 1995, pp. 713-718 (including 1 page English translation), vol. 621, Issue 5.

Philipp Pust et al., "Group (III) Nitrides M[Mg2Al2N4] (M = Ca,Sr,Ba,Eu) and Ba[Mg2Ga2N4]—Structural Relation and Nontypical Luminescence Properties of Eu2+ Doped Samples", Chemistry of Materials, 2014, pp. 6113-6119, vol. 26, American Chemical Society Publications.

Peter Wagatha et al., "Ca18.75Li10.5[Al39N55]:Eu2+— Supertetrahedron Phosphor for Solid-State Lighting", Chemistry of Materials, 2016, 28, pp. 1220-1226, vol. 26, American Chemical Society Publications.

(56) References Cited

OTHER PUBLICATIONS

Dominik Wilhelm et al., "Narrow-Band Red Emission in the Nitridolithoaluminate Sr4[LiAl11N14)Eu2+", Chemistry of Materials, 2017, pp. 1204-1209, vol. 29, American Chemical Society Publications.

International Search Report issued for international counterpart application PCT/EP2018/053416, dated May 2, 2018 (for reference purpose only).

International Search Report issued for international counterpart application PCT/EP2018/080607, dated Feb. 14, 2019 (for reference purpose only).

U.S. Non-Final Office Action based on U.S. Appl. No. 16/324,924 (22 pages) dated Jul. 31, 2019 (for reference purpose only).

German Search Report based on Application No. 10 2018 108 842.6, dated Dec. 11, 2018, 6 pages (for reference purpose only).

U.S. Office Action based on U.S. Appl. No. 16/198,812, dated Aug. 6, 2019, 35 pages (for reference purpose only).

Notice of Allowance based on U.S. Appl. No. 16/302,724 (9 pages) dated Sep. 30, 2019 (for reference purpose only).

Notice of Allowance issued for corresponding U.S. Appl. No. 16/202,188 dated Mar. 6, 2020, 10 pages (for informational purpose only).

Notification of Reason for Refusal issued for the Japanese patent application No. 2019507204, dated May 10, 2021, 3 pages (for informational purposes only).

U.S. Non-Final Office Action based on U.S. Appl. No. 16/637,282, dated Nov. 11, 2020, 10 pages (for informational purposes only).

U.S. Non-Final Office Action based on U.S. Appl. No. 16/926,821, dated Jun. 24, 2021, 6 pages (for informational purposes only).

Office Action for U.S. Appl. No. 16/202,182, dated Oct. 5, 2021, 20 pages (for reference purposes only).

Freia Ruegenberg et al., "A Double-Band Emitter with Ultranarrow-Band Blue and Narrow-Band Green Luminescence", Chemistry A European Journal, 2020, pp. 2204-2210, Wiley-VCH Verlag GmbH & Co. KGaA.

Search report for German patent application No. 10 2020 204 429.5, dated January, 8, 2021, 5 pages (for reference purposes only).

Search Report for international application No. PCT/EP2021/058221, dated Jun. 21, 2021, 4 pages (for reference purposes only).

Lili Wang et al., "Narrow-band green emission of Eu2+ in a rigid tunnel structure: site occupations, barycenter energy calculations and luminescence properties", Inorganic Chemistry Frontiers, 2019, pp. 3604-3612, vol. 6.

Ming Zhao et al., "Discovery of New Narrow-Band Phosphors with the UCr4C4-Related Type Structure by Alkali Cation Effect", Advanced Optical Materials, 2019, 9 pages, vol. 7, Wiley-Vch Verlag GmbH & Co. KGaA.

Office Action for U.S. Appl. No. 16/302,748, dated Oct. 4, 2021, 11 pages (for reference purposes only).

Daniel Dutzler et al., "Alkali Lithosilicates: Renaissance of a Reputable Substance Class with Surprising Luminescence Properties", Angewandte Chemie International Edition, Aug. 13, 2018, pp. 13676-13680, vol. 57, Wiley-Vch Verlag GmbH & Co. KGaA.

German Search Report based on 10 2016 121 694.1 (9 pages) dated Jul. 7, 2017 (for reference purpose only).

Hongxu Liao et al., "Learning from a Mineral Structure toward an Ultra-Narrow-Band Blue-Emitting Silicate Phosphor RbNa 3 (Li 3 SiO 4 ) 4 :Eu 2+", Angewandte Chemie International Edition, Aug. 3, 2018, 5 pages, vol. 57, Wiley-Vch Verlag GmbH & Co. KGaA.

International Search Report based on PCT/EP2017/070343 (3 pages) dated Nov. 10, 2017 (for reference purpose only).

Ming Zhao et al., "Emerging ultra-narrow-band cyan-emitting phosphor for white LEDs with enhanced color rendition", Light: Science & Applications, Apr. 10, 2019, 9 pages, vol. 8.

Ming Zhao et al., "Next-Generation Narrow-Band Green-Emitting RbLi(Li 3 SiO 4 ) 2 :Eu 2+ Phosphor for Backlight Display Application", Advanced Materials, Aug. 8, 2018, 8 pages, vol. 30, Wiley-Vch Verlag GmbH & Co. KGaA.

Wei Wang et al., "Photoluminescence Control of UCr4C4-Typed Phosphors with Superior Luminous Efficiency and High Color Purity via Controlling Site-Selection of Eu2+ Activators", Chemistry of Materials, 2019, pp. 9200-9210, vol. 31, American Chemical Society Publications.

R. Werthmann et al., "Ueber Oxide des neuen Formeltyps A[T4O4]: Zur Kenntnis von KLi3GeO4, KLi3SiO4 und KLi3TiO4", Zeitschrift für anorganische und allgemeine Chemie, 1984, pp. 7-22.

Notification of Reason for Refusal issued for the Japanese patent application No. 2019507203, dated May 10, 2021, 3 pages (for informational purposes only).

Non-Final Office Action for parallel U.S. Appl. No. 16/762,506; dated Mar. 15, 2022; 15 pages (for information purposes only).

Decision to Grant a Patent for corresponding Japanese Patent Application No. 2019-524388, dated Mar. 14, 2022, 2 pages (For reference purposes only).

\* cited by examiner

LIGHTING DEVICE AND USE OF LIGHTING DEVICE

CROSS-REFERENCE TO RELATED APPLICATIONS

The present application is a national stage entry according to 35 U.S.C. § 371 of PCT application No. PCT/EP2018/078984 filed on Oct. 23, 2018; which claims priority to PCT Patent Application Serial No. PCT/EP2017/078913 filed on Nov. 10, 2017, as well as German Patent Application Serial No. 10 2018 205 464.9 filed on Apr. 11, 2018; all of which are incorporated herein by reference in their entirety and for all purposes.

TECHNICAL FIELD

The disclosure relates to a lighting device. The disclosure also relates to the use of a lighting device.

BACKGROUND

Tail or brake lights in vehicles and traffic light applications require light emitting diodes (LEDs) that emit a red total radiation. For this purpose, conversion LEDs with a blue-emitting semiconductor chip and a red fluorescent material are normally used, which completely converts the blue primary radiation of the semiconductor chip into a red secondary radiation and is emitted by the conversion LED as the total radiation. This full conversion leads to a loss of efficiency, however, since it typically requires a high fluorescent material content, which leads to scattering losses. In order to obtain a chromaticity coordinate of the total radiation with a saturated red, the dominant wavelength of the total radiation should be at a wavelength of 590 nm. Known fluorescent materials, which have an emission with a dominant wavelength of over 590 nm, disadvantageously exhibit a broad emission that extends into the infrared range of the electromagnetic spectrum. As a result, on the one hand the visual efficiency decreases and, on the other hand, the emission in the infrared range does not contribute to the chromaticity coordinate of the total radiation, which increases the amount of fluorescent material required.

It would be desirable to specify a lighting device which efficiently emits a total radiation in the red region of the electromagnetic spectrum. A further object is to use the lighting device for tail or brake lights in vehicles and traffic lights.

SUMMARY

This object or these objects is/are achieved by a lighting device and the use of a lighting device.

A lighting device for emitting a red total radiation is specified. Therefore, the lighting device therefore emits, in particular, a total radiation that is selected from the red region of the electromagnetic spectrum.

The red region of the electromagnetic spectrum can be defined as the region between 590 nm and 780 nm.

The lighting device comprises a semiconductor layer sequence which is configured for emitting electromagnetic primary radiation, and a conversion element which comprises a first fluorescent material of the formula $Sr[Al_2Li_2O_2N_2]$:Eu, crystallized in the tetragonal space group $P4_2/m$. The first fluorescent material at least partially converts the electromagnetic primary radiation into an electromagnetic secondary radiation in the red region of the electromagnetic spectrum. In particular, the first fluorescent material is $Sr[Al_2Li_2O_2N_2]$:$Eu^{2+}$.

Here and in the following, fluorescent materials are described in terms of sum formulas. In the specified sum formulas it is possible that the fluorescent has further elements, for example in the form of impurities, in which case, taken together, these impurities have a maximum component by weight of the fluorescent 1% or 100 ppm (parts per million) or 10 ppm.

While the crystal structure of the first fluorescent material $Sr[Al_2Li_2O_2N_2]$:Eu in the tetragonal space group $P4_2/m$ can be described as a superstructure of $UCr_4C_4$, the Bravais-lattice types of these structures are in fact different. Therefore the first fluorescent described here does not crystallize in the crystal structure of $UCr_4C_4$. The $UCr_4C_4$ type can be described in the space group $I4/m$.

In the single crystal x-ray structure analysis, depending on the symmetry of the crystal structure being examined, not all theoretically possible reflexes are actually observed in practice. In the present case, on the basis of the space group $I4/m$ in the $UCr_4C_4$-structure, it is the case that a reflex with the index 100 should not be observable, since 1+0+0 is odd (corresponds to the symmetry-related integral cancellation conditions $h+k+l \neq 2n$ (odd) for I-centric lattices). Since this reflex can be observed in the first fluorescent material and the former also crystallizes in a tetragonal space group, it is clear that the crystal structure does not have the same space group as the $UCr_4C_4$ structure.

In comparison to a fluorescent which has the space group of $UCr_4C_4$, the primitive lattice of the first fluorescent material described here exhibits no such cancellation conditions and leads to the appearance of additional reflexes, for example with the index 100 at approximately 11.11° 2 θ (for copper-Kai radiation) with an atomic plane spacing (d-value) of approximately 7.96 Å.

In accordance with at least one embodiment the first fluorescent does not crystallize in the space group $I4/m$ or the crystal structure of the $UCr_4C_4$ type.

In accordance with at least one embodiment, the first fluorescent material with the formula $SrLi_2Al_2N_2O_2$:Eu has the lattice parameters of, for example, a=7.952 (2) Å, c=3.1843 (12) Å.

In accordance with at least one embodiment the first fluorescent emits a secondary radiation with a dominant wavelength between 590 nm and 620 nm inclusive, such as between 595 nm and 615 nm inclusive, or between 600 nm and 610 nm inclusive.

The dominant wavelength is a means of describing non-spectral (polychromatic) light mixtures by means of spectral (monochromatic) light which creates a similar color percept. In the CIE color space, the line which connects a point for a specific color and the point CIE-x=0.333, CIE-y=0.333 can be extrapolated such that it meets the outline of the space in two points. The point of intersection which is closer to the said color represents the dominant wavelength of the color as a wavelength of the pure spectral color at this intersection point. The dominant wavelength is thus the wavelength that is perceived by the human eye.

For example, the first fluorescent material of the formula $SrLi_2Al_2O_2N_2$:Eu, which crystallizes in the space group $P4_2/m$ under excitation with a primary radiation with a wavelength of 460 nm, emits in the red spectral range of the electromagnetic spectrum with a dominant wavelength between 590 nm and 620 nm inclusive and exhibits a narrow-band emission, in other words an emission with a small half-value width, such as with a half-value width of less than 50 nm.

The half-value width is understood here and in the following text to mean the spectral width at half the maximum height of the emission peak, or FWHM for short, standing for 'full width at half maximum'. An emission peak is understood to mean the peak with the maximum intensity.

In accordance with at least one embodiment, the first fluorescent material has a secondary radiation with a maximum peak wavelength of 614 Nm+/−10 nm, 9 nm, 8 nm, 7 nm, 6 nm, 5 nm, 4 nm, 3 nm, 2 nm or 1 nm and/or a half-value width of less than 70 nm, less than 65 nm or less than 60 nm, in particular less than 55 nm, such as less than 50 nm, for example 48 nm.

The "peak wavelength" can refer in the present case to the wavelength in the emission spectrum at which the maximum intensity occurs in the emission spectrum.

In accordance with at least one embodiment the half-value width of the first fluorescent material is less than 55 nm, such as less than 50 nm, for example less than or equal to 45 nm.

In accordance with at least one embodiment the conversion element comprises a second fluorescent material, which at least partially, or only partially, converts the electromagnetic primary radiation into an electromagnetic secondary radiation in the red region of the electromagnetic spectrum. The conversion element can also consist of the first and the second fluorescent. The first and the second fluorescent can partially or completely convert the primary radiation into a secondary radiation. Thus it is possible that both the first and the second fluorescent material partially convert the primary radiation, but the primary radiation is fully converted by both fluorescent materials and therefore does not contribute to the total radiation. It is also possible that the second fluorescent material additionally partially absorbs and converts the secondary radiation of the first fluorescent material.

In accordance with at least one embodiment the conversion element comprises a third fluorescent material, which at least partially, or only partially, converts the electromagnetic primary radiation into an electromagnetic secondary radiation in the red region of the electromagnetic spectrum. The conversion element can also consist of the first, second and third fluorescent material. The first, the second and the third fluorescent material can partially or completely convert the primary radiation into a secondary radiation. Thus it is possible that both the second and the third fluorescent material partially convert the primary radiation, but the primary radiation is fully converted by the three fluorescent materials and therefore does not contribute to the total radiation. It is also possible that the second or the third fluorescent material additionally partially absorbs and converts the secondary radiation of the first fluorescent material.

By means of the second, or the second and the third fluorescent material, the chromaticity coordinate of the total radiation can advantageously be adjusted as needed. For example, this allows chromaticity coordinates which lie within the ECE standard for tail and brake lights for vehicles, or within the standard for red traffic lights, to be achieved. This also allows a particularly high color saturation and efficiency to be obtained, which cannot usually be achieved by the use of only one fluorescent material. In particular, by a suitable mixture ratio of the fluorescent materials the total radiation can be optimized with regard to the overlap with the eye sensitivity curve and thus the efficiency and the location of the chromaticity coordinate.

In accordance with at least one embodiment the amount of first fluorescent material in the conversion element in relation to the total amount of first and second or first, second, and third fluorescent materials is between 5 and 95 weight percent inclusive, for example, between 20 and 95 weight percent inclusive, between 50 and 95 weight percent inclusive, between 75 and 95 weight percent inclusive, or between 80 and 95 weight percent inclusive. By varying the mixing ratio of the fluorescent materials the chromaticity coordinate, in particular, may be adjusted as needed.

In accordance with at least one embodiment, a majority of the converted photons of the total radiation is formed by the first fluorescent. For example, the proportion of converted photons of the first fluorescent material is between 40 and 98 percent.

The inventors have recognized that a second, or a second and a third, fluorescent material in addition to the already very efficient first fluorescent material, which crystallizes in the space group P4$_2$/m, gives rise to an unexpectedly high luminescence efficiency and color saturation of the red total radiation of the lighting device. By means of the narrow-band secondary radiation of the first fluorescent material, the secondary radiation thereof has a high degree of overlap with the eye sensitivity curve, which explains the very high efficiency. By means of the second, or the second and the third fluorescent material, both the efficiency and the color saturation of the total radiation are further increased.

Alternatively or in addition to the second fluorescent material or the second and the third fluorescent material, the lighting device can comprise a mirror or filter arranged over the conversion element. The mirror, in particular a dichroic mirror or Bragg mirror or filter, is configured to reflect or to filter the primary radiation, so that this does not escape from the mirror or filter and therefore from the lighting device. In particular, the mirror or filter is thus designed to be non-permeable to the primary radiation and permeable to the secondary radiation, so that the total radiation which is emitted to the outside corresponds to the secondary radiation of the first fluorescent material or of the first fluorescent material and the other fluorescent materials. In particular, the primary radiation is reflected back by the mirror. In particular, the lighting device comprises a mirror or filter if the first or the first and the other fluorescent materials only partially convert the primary radiation into a secondary radiation.

In accordance with at least one embodiment the mirror or filter is arranged on a main surface of the conversion element facing away from the semiconductor layer sequence. The main surface of the conversion element in this case extends, in particular, parallel to the main extension plane of the conversion element or the semiconductor layer sequence. Another possibility is that the mirror or filter is additionally arranged over the lateral faces of the conversion element. In a non-limiting embodiment, the mirror or the filter is in direct mechanical contact with the conversion element. The mirror or filter can be arranged over part of or all, e.g. all, of the main surface of the conversion element facing away from the semiconductor layer sequence. For example, in the case of a partial arrangement of the mirror or the filter, the lateral edges of the main surface of the conversion element may not be covered with the filter or mirror.

In accordance with at least one embodiment the conversion element or the lighting device comprises only the first fluorescent material and thus, in particular, no additional fluorescent material. The lighting device also contains a mirror or filter arranged over the conversion element. By filtering out the primary radiation by means of the filter or reflecting back the primary radiation by means of the mirror, the total radiation is located in the red region of the electromagnetic spectrum even if the primary radiation is only partially converted by the first fluorescent material.

In accordance with at least one embodiment, the second fluorescent material has the general formula

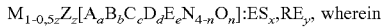

$M_{1-0.5z}Z_z[A_aB_bC_cD_dE_eN_{4-n}O_n]:ES_x,RE_y$, wherein

M=Ca, Sr and/or Ba;
Z=Na, K, Rb, Cs and/or Ag;
A=Mg, Mn and/or Zn;
B=B, Al and/or Ga;
C=Si, Ge, Ti, Zr, and/or Hf;
D=Li and/or Cu;
E=P, V, Nb and/or Ta;
ES=$Ce^{3+}$;
RE=$Eu^{2+}$, $Eu^{3+}$, $Yb^{2+}$ and/or $Yb^{3+}$;
$0 \le x \le 0.2$; $0 \le y \le 0.2$; $0 < x+y \le 0.4$; $0 \le z \le 1$; $0 \le n \le 4$; $0 \le a \le 4$; $0 \le b \le 4$; $0 \le c \le 4$; $0 \le d \le 4$; $0 \le e \le 4$; a+b+c+d+e=4 and 2a+3b+4c+d+5e=10−n+Z. The second fluorescent material crystallizes in the space group I4/m.

In accordance with at least one embodiment, the second fluorescent material has the general formula

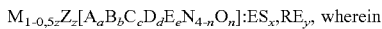

$M_{1-0.5z}Z_z[A_aB_bC_cD_dE_eN_{4-n}O_n]:ES_x,RE_y$, wherein

M=Ca, Sr and/or Ba;
Z=Na, K, Rb, Cs and/or Ag;
A=Mg, Mn and/or Zn;
B=B, Al and/or Ga;
C=Si, Ge, Ti, Zr and/or Hf;
D=Li and/or Cu;
E=P, V, Nb and/or Ta;
ES=$Ce^{3+}$;
RE=$Eu^{2+}$, $Eu^{3+}$, $Yb^{2+}$, $Yb^{3+}$;
$0 \le x \le 0.2$; $0 \le y \le 0.2$; $0 < x+y \le 0.2$; $0 \le z \le 0.9$ or $0 \le z \le 0.5$; $0 \le n \le 4$; $0 \le a \le 4$; $0 \le b \le 4$; $0 \le c \le 4$; $0 \le d \le 4$; $0 \le e \le 4$; a+b+c+d+e=4 and 2a+3b+4c+d+5E=10−n+z. The second fluorescent material crystallizes in the space group I4/m.

In accordance with at least one embodiment the second fluorescent material has the general formula $M_{(1-y)}[B_bD_dN_{4-n}O_n]:RE_y$, wherein M=Ca, Sr and/or Ba;
B=B, Al and/or Ga;
D=Li and/or Cu;
RE=$Eu^{2+}$;
$0 < y \le 0.2$; $0 \le n \le 4$; $0 \le b \le 4$; $0 \le d \le 4$ and b+d=4. The second fluorescent material crystallizes in the space group I4/m.

In accordance with at least one embodiment, the second fluorescent has the formula $Sr[Al_2Li_2O_2N_2]:Eu$, such as $Sr[Al_2Li_2O_2N_2]:Eu^{2+}$ and crystallizes in the space group I4/m. The combination of the first fluorescent material $Sr[Al_2Li_2O_2N_2]:Eu^{2+}$, which crystallizes in the space group $P4_2/m$, with a second fluorescent material of the formula $Sr[Al_2Li_2O_2N_2]:Eu$ which crystallizes in the space group I4/m has surprisingly proven particularly advantageous with regard to the efficiency and the color saturation of the total radiation.

In accordance with at least one embodiment, the second fluorescent material has the general formula

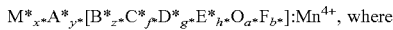

$M^*_{x^*}A^*_{y^*}[B^*_{z^*}C^*_{f^*}D^*_{g^*}E^*_{h^*}O_{a^*}F_{b^*}]:Mn^{4+}$, where A*=Li, Na, K, Rb, Cs, Cu, Ag and/or $NH_4$;
M*=Be, Mg, Ca, Ba, Sr, Zn and/or Sn;
B*=Si, Ge, Sn, Ti, Zr and/or Hf;
C*=Al, Ga, In, Gd, Y, Sc, La, Tb, Bi and/or Cr;
D*=Nb, Ta and/or V;
E*=W and/or Mo;
2x+y=−(4z+3f+5g+6h+4c−2+a−b);
$0 \le x^*$; $0 \le y^*$; $0 \le z^*$; $0 \le f^*$; $0 \le g^*$; $0 \le h^*$; $0 \le a^*$; $0 \le b^*$; $x^*+y^*+z^*+f^*+g^*+h^* > 0$ and $a^*+b^* > 0$.

In accordance with at least one embodiment, the second fluorescent material has the general formula $A^*_2B^*F_6:Mn^{4+}$, where A*=Li, Na, K, Rb, Cs, Cu, Ag and/or $NH_4$ and
B*=Si, Ge, Sn, Ti, Zr and/or Hf.

In accordance with at least one embodiment, the second fluorescent material has the general formula $Na_2SiF_6:Mn^{4+}$, $K_2TiF_6:Mn^{4+}$ or $K_2SiF_6:Mn^{4+}$. In a non-limiting embodiment, the second fluorescent material is $K_2SiF_6:Mn^{4+}$. Due to the narrow-band emission, in particular of $K_2SiF_6:Mn^{4+}$ as the second fluorescent, and the narrow-band emission of the first fluorescent material, the secondary radiation is located outside or only marginally inside the infrared range, so that here no or only a minimal amount of radiation is lost and the secondary radiation contributes totally or almost totally to the chromaticity coordinate of the total radiation, so that the amount of fluorescent material required can be kept low.

In accordance with at least one embodiment, the second fluorescent material has the general formula $(4-x)MgO \cdot xMgF_2 \cdot GeO_2:Mn^{4+}$, $A_2Ge_4O_9:Mn^{4+}$ or $A_3A'Ge_8O_{18}:Mn^{4+}$, where $0 \le x \le 4$;

A=Li, K, Na and/or Rb and
A'=Li, K, Na and/or Rb. The second fluorescent material is selected from $Mg_4GeO_3:Mn^{4+}$, $K_2Ge_4O_9:Mn^{4+}$, $Rb_2Ge_4O_9:Mn^{4+}$ or $Li_3RbGe_8O_{18}:Mn^{4+}$.

In accordance with at least one embodiment the second fluorescent material is selected from $Sr_4Al_{14}O_{25}:Mn^{4+}$, $Mg_2TiO_4:Mn^{4+}$, $CaZrO_3:Mn^{4+}$, $Gd_3Ga_5O_{12}:Mn^{4+}$, $Al_2O_3:Mn^{4+}$, $GdAlO_3:Mn^{4+}$, $LaAlO_3:Mn^{4+}$, $LiAl_5O_8:Mn^{4+}$, $SrTiO_3:Mn^{4+}$, $Y_2Ti_2O_7:Mn^{4+}$, $Y_2Sn_2O_7:Mn^{4+}$, $CaAl_{12}O_{19}:Mn^{4+}$, $MgO:Mn^{4+}$ and $Ba_2LaNbO_6:Mn^{4+}$.

In accordance with at least one embodiment the second fluorescent material is selected from quantum dots comprising a semiconducting material. The semiconducting material can be selected from CdS, CdSe, CdTe, ZnS, ZnTe, HgTe, HgSe, GaP, GaAs, GaSb, AlP, AlAs, AlSb, InP, InAs, InSb, SiC, InN, AlN and combinations thereof. The quantum dots can have, for example, a core of the semiconducting material, wherein the core is surrounded, e.g. completely surrounded, by a shell made of an inorganic material. It is also possible to select quantum dots with an alloy structure. Quantum dots with an alloy structure have a core, a first shell and a second shell, wherein the first shell partially or completely surrounds the core and the second shell partially or completely surrounds the first shell. The first shell is formed from the material of the core and the material of the second shell. For example, if the core is made of CdSe, the first shell is formed of $Cd_2SSe$ and the second shell of CdS.

Due to the narrow-band emission of quantum dots and the narrow-band emission of the first fluorescent material, the secondary radiation is located outside or only marginally inside the infrared range, so that here no or only a minimal amount of radiation is lost and the secondary radiation contributes totally or almost totally to the chromaticity coordinate of the total radiation, so that the amount of fluorescent material needed can be kept low. The use of quantum dots as a second fluorescent material has therefore proved to be particularly advantageous.

In accordance with at least one embodiment the second fluorescent material is selected from semiconductor perovskites. The semiconductor perovskites have the general formula $ZMX_3$ with Z=Cs, $CH_3NH_3$, $CH(NH_2)_2$ and/or $(CH_3)_3NH$;

M=Pb, Sn, Ge, Mn, Cd and/or Zn and
X=Br, I and/or SCN or
the general formula $A^I_2M^{II}M^{III}X_6$ with
$A^I$=Cs, $CH_3NH_3$, $CH(NH_2)_2$ and/or $(CH_3)_3NH$;
$M^I$=Ag, K, Tl and/or Au;
$M^{III}$=Sb, Bi, As and/or Sn and
X=Br, I and/or SCN. As semiconductor perovskites, $Cs_3Sb_2I_9$, $(CH_3NH_3)_3Sb_2I_9$ or $Cs_2SnI_6$ can also be used.

If the conversion element comprises a third fluorescent material the third fluorescent can be selected from the same fluorescent materials as the second fluorescent. In particular, the second and the third fluorescent material are different fluorescent materials.

In accordance with at least one embodiment the conversion element comprises the first fluorescent material, a second and a third fluorescent material. The second fluorescent material has the formula $M_{(1-0,5z)}Z_z[A_aB_bC_cD_dE_eN_{4-n}O_n]:ES_x$, $RE_y$, such as $M_{(1-y)}[B_bD_dN_{4-n}O_n]:RE_y$, for example $Sr[Al_2Li_2O_2N_2]$:Eu and crystallizes in the space group I4/m. The third fluorescent material has the general formula $M^*_{x*}A^*_{y*}[B^*_{z*}C^*_{f*}D^*_{g*}E^*_{h*}O_a*F_{b*}]:Mn^{4+}$. In a non-limiting embodiment, the third fluorescent material is $A^*_2B^*F_6:Mn^{4+}$, e.g. $K_2SiF_6:Mn^{4+}$.

In accordance with at least one embodiment the semiconductor layer sequence has at least one III-V compound semiconductor material. The semiconductor material is, for example, a nitride compound semiconductor material, such as $Al_nIn_{1-n-m}Ga_mN$, or a phosphide compound semiconductor material, such as $Al_nIn_{1-n-m}Ga_mP$, or also an arsenide compound semiconductor material, such as $Al_nIn_{1-n-m}Ga_m$As, where in each case $0 \le n \le 1$, $0 \le m \le 1$ and $n+m \le 1$. In this case, the semiconductor layer sequence can comprise dopants and additional components. For the sake of simplicity however, only the essential components of the crystal lattice of the semiconductor layer sequence, thus Al, As, Ga, In, N or P are given, even if these may be partially supplemented and/or substituted by trace amounts of other substances. In particular, the semiconductor layer is formed of InGaN.

The semiconductor layer sequence includes an active layer with at least one pn-junction and/or one or more quantum well structures. In the operation of the lighting device an electromagnetic radiation is generated in the active layer. A wavelength or the wavelength maximum of the radiation is located in the ultraviolet and/or visible range, in particular at wavelengths between 360 nm and 550 nm inclusive, for example between 400 nm and 500 nm inclusive, in particular between 420 nm and 480 nm inclusive.

In accordance with at least one embodiment, the lighting device is a light-emitting diode, LED for short, in particular a conversion LED.

In combination with the first and second fluorescent materials present in the lighting device or the first, second and third fluorescent materials the lighting device is configured to emit a red total radiation in full conversion.

In an alternative embodiment, in combination with the first, first and second or the first, second and third fluorescent materials present in the lighting device and the mirror or filter, the lighting device is configured to emit a red total radiation in partial conversion and filtering.

In accordance with at least one embodiment, the first fluorescent material or the first fluorescent material and the additional fluorescent materials partially convert the electromagnetic primary radiation into electromagnetic secondary radiation. This can also be referred to as partial conversion. In accordance with this embodiment the lighting device comprises a mirror or filter arranged over the conversion element. It can thus be ensured that the total radiation emitted to the outside contains no or almost no primary radiation.

In accordance with at least one embodiment, the first and the additional fluorescent materials are present in a matrix. Silicones and/or siloxanes can be used for the matrix. Alternatively, a glass matrix can be used, the glass matrix can be selected in particular from phosphates, silicates, borates, aluminates, sulfates, and combinations thereof. For example, the glass matrix can be selected from $SiO_2$, $Al_2O_3$, $Al_3PO_4$ and combinations thereof.

Alternatively, the fluorescent materials can also exist in the form of a converter ceramic. For this purpose, the conversion element can be composed of the fluorescent materials, or the fluorescent materials can be introduced into a ceramic matrix. The ceramic matrix can be, for example, $Al_2O_3$, $(Y,Lu,Sc)Al_5O_{12}$, AlN, $Si_3N_4$, such as $(Ba, Sr, Ca)Si_2O_2N_2$, $(Li,Mg,Ca,Y)_xSi_{12-m-n}Al_{m+n}O_nN_{16-n}$ with v=valency of M, $0.001 \le x \le 0.1$ and $0.5 \le m=2n \le 3.5$ (α-SiAlON), $\beta$-$Si_{6-z}Al_zO_zN_{8-z}$ with $0.1 \le z \le 2$) (β-SiAlON), nitridoorthosilicates such as $AE_{2-x}RE_xSi_{1-y}O_{4-x-2y}N_x$:Eu with x=0-2, RE=Sc, Y, La, Lu and AE=Ca, Sr, Ba and/or Mg, $Sr_3Si_{13}Al_3O_2N_{21}$ or $Ba_3Si_6O_{12}N_2$. In a non-limiting embodiment, oxynitride ceramic matrix materials can comprise a cation from the group of alkali metals, alkaline earth metals or the lanthanides, and the crystal lattice is built from the elements Al, Si, Li and/or Nb and O and N.

The conversion element can be applied directly on or spaced apart from the semiconductor layer sequence. The conversion element can be designed square or rectangular.

In accordance with at least one embodiment the lighting device is formed as a lamp, in particular as a lamp for a motor vehicle or traffic light, for example as a tail light and/or brake light for a motor vehicle.

In particular, all statements and definitions for the lighting device also apply to the use of the lighting device, and vice versa. The lighting device is used, in particular, as a lamp for a motor vehicle or traffic light, for example as a tail light and/or brake light for a motor vehicle.

The first fluorescent material can be produced by means of a solid-state reaction. This can be achieved by mixing the reactants of the fluorescent material. For example, strontium nitride ($Sr_3N_2$), aluminum nitride (AlN), aluminum oxide ($Al_2O_3$), lithium nitride ($Li_3N$) and europium oxide ($Eu_2O_3$) can be used to produce $SrLi_2Al_2O_2N_2$:Eu. The reactants are mixed together in an appropriate ratio. The reactants can be placed into a nickel crucible, for example. Then, the mixture can be heated to a temperature between 700° C. and 1000° C., such as 800° C. In addition, the heating can be carried out in a forming gas stream, the temperature being maintained for 1 to 400 hours. The proportion of hydrogen ($H_2$) in the nitrogen ($N_2$) can be, for example, 7.5%.

The heating and cooling rates can be, for example, 250° C. per hour.

As an alternative to the procedure described above, the first fluorescent material can also be produced with a solid-state synthesis in a tantalum ampoule that has been sealed by welding. To do so, the reactants, such as, in the case of the fluorescent substance $SrLi_2Al_2N_2O_2$:Eu, $Sr_3A_{12}O_6$, Li(flux), $LiN_3$ and $Eu_2O_3$, can be mixed with each other in an appropriate mixture ratio and placed in a tantalum ampoule. The procedure involves, for example, heating from room temperature to 800° C., then holding the temperature for, for example, 100 hours and the system then being cooled back down to room temperature and the fluorescent is generated.

In accordance with at least one embodiment the reactants of the first fluorescent material are present in powder form.

In accordance with at least one embodiment, the heating step is followed by a cooling process in which the mixture is cooled to room temperature. Room temperature may be understood, in particular, as a temperature of 20° C. or 25° C.

In accordance with at least one embodiment, the temperature is kept at this value for between 1 hour and 400 hours, for example, 100 hours. In particular, the annealing of the fluorescent material takes place in this period.

The synthesis is performed at moderate temperatures and is therefore very energy efficient. The requirements, for example on the ovens used, are therefore low. The reagents are commercially available at low cost and are non-toxic.

BRIEF DESCRIPTION OF THE DRAWINGS

In the following, the lighting device described herein is explained in more detail in conjunction with non-limiting embodiments and the associated figures.

Identical, similar or similar-looking elements are provided with the same reference signs in the figures. The figures and the proportions of the elements depicted in the figures relative to each other are not to be considered as true to scale. Rather, individual elements may be displayed in an exaggeratedly large format for better presentation and/or comprehensibility.

DETAILED DESCRIPTION

Figure 1A:
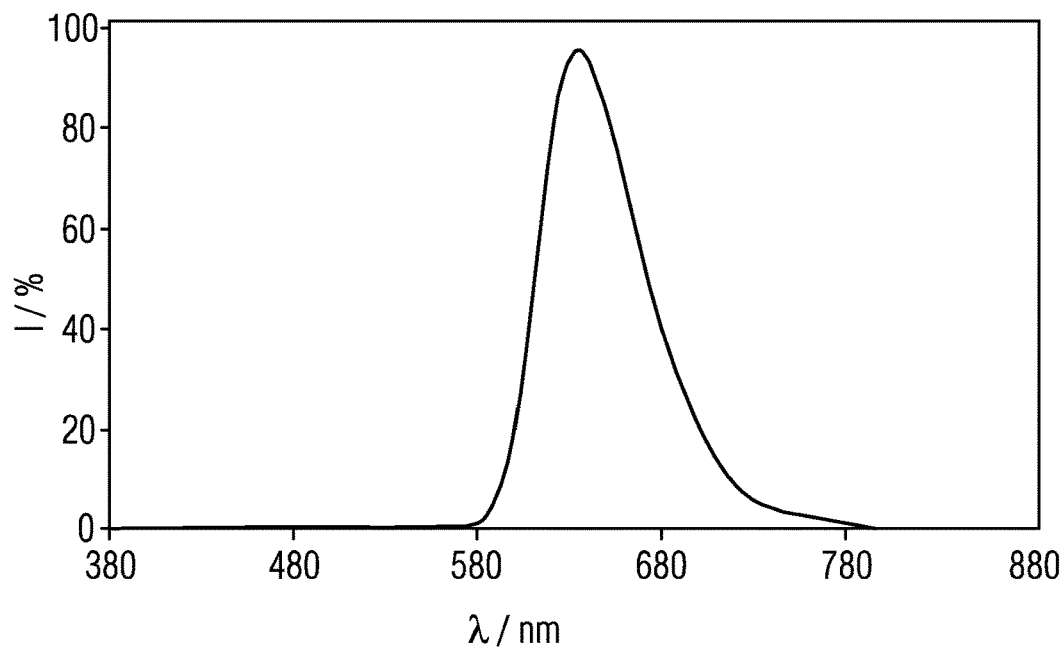
FIG. 1A illustrates an emission spectrum of the total radiation of a conversion LED that has a semiconductor chip emitting a primary radiation in the blue region of the electromagnetic spectrum.
Figure 1B:
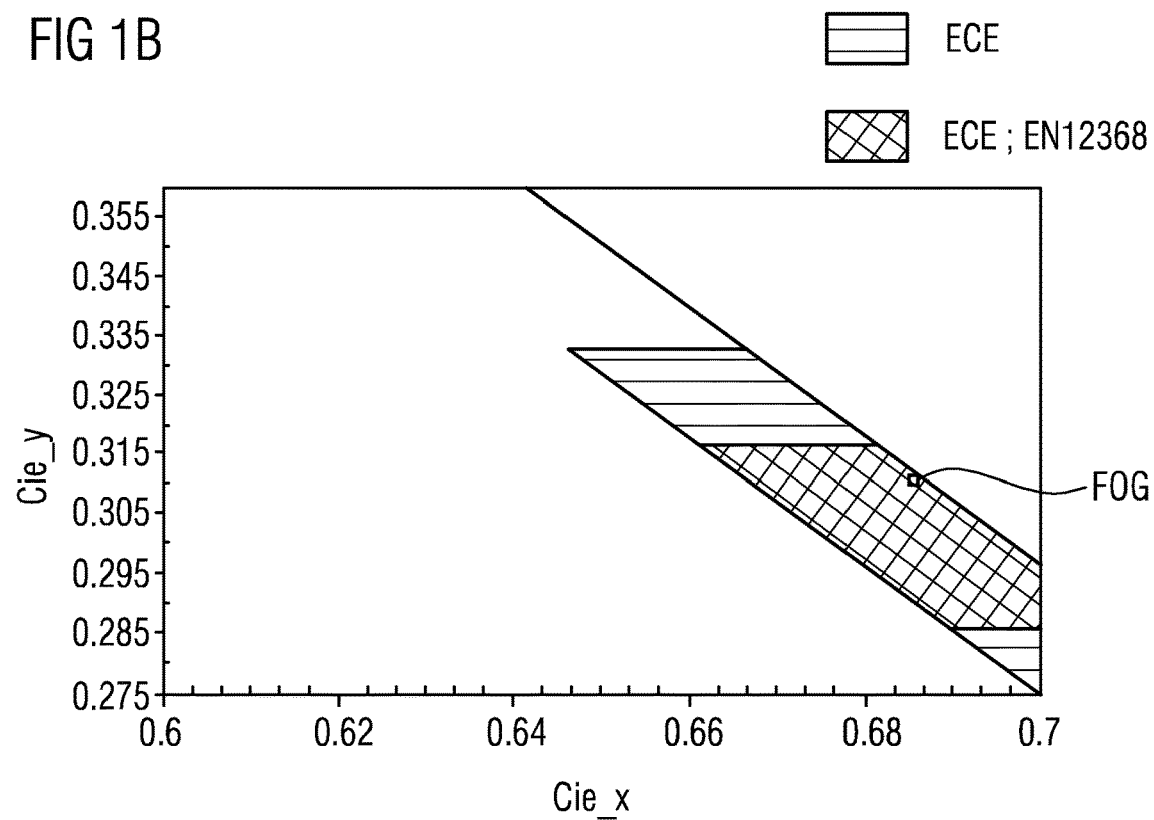
FIG. 1B depicts a chromaticity coordinate of the total radiation of the conversion LED (FOG) in the CIE color space.

FIG. 1A shows an emission spectrum of the total radiation of a conversion LED, which comprises a semiconductor chip which emits a primary radiation in the blue region of the electromagnetic spectrum. In addition, the conversion LED comprises a first fluorescent material of the formula $Sr[Al_2Li_2O_2N_2]$:Eu which crystallizes in the tetragonal space group $P4_2/m$, and a second fluorescent material of the formula $Sr[Al_2Li_2O_2N_2]$:Eu, which crystallizes in the space group I4/m. The second fluorescent is present at 5 to 10 percent by weight as a proportion of the total fluorescent material. The conversion LED contains no other fluorescent material in addition to the first and second fluorescent material. The first and the second fluorescent material completely convert the primary radiation into a secondary radiation in the red region of the electromagnetic spectrum, so that the secondary radiation corresponds to the total radiation of the conversion LED. The chromaticity coordinate of the total radiation is located in the red region of the electromagnetic spectrum. The chromaticity coordinate of the total radiation of the conversion LED (FOG) in the CIE color space is shown in FIG. 1B. It is clear from FIG. 1B that the chromaticity coordinate of the total radiation of the conversion LED (FOG) is in the red ECE color range for automotive applications and also within the color range for the traffic-light standard EN 12368. The ECE regulation is ECE-R48. Surprisingly, by combining the first and second fluorescent material a particularly high color saturation and efficiency of the total radiation can be achieved. Such a high color saturation and efficiency of the total radiation cannot be achieved with the use of only one of the two fluorescent materials. The chromaticity coordinate can advantageously be adjusted as required by changing the percentage by weight of the two fluorescent materials in relation to the total amount of fluorescent material. According to the current state of the art it is not possible to achieve an equivalent spectral efficiency with any other EU-doped fluorescent material with an emission in this color range.

Figure 2A:
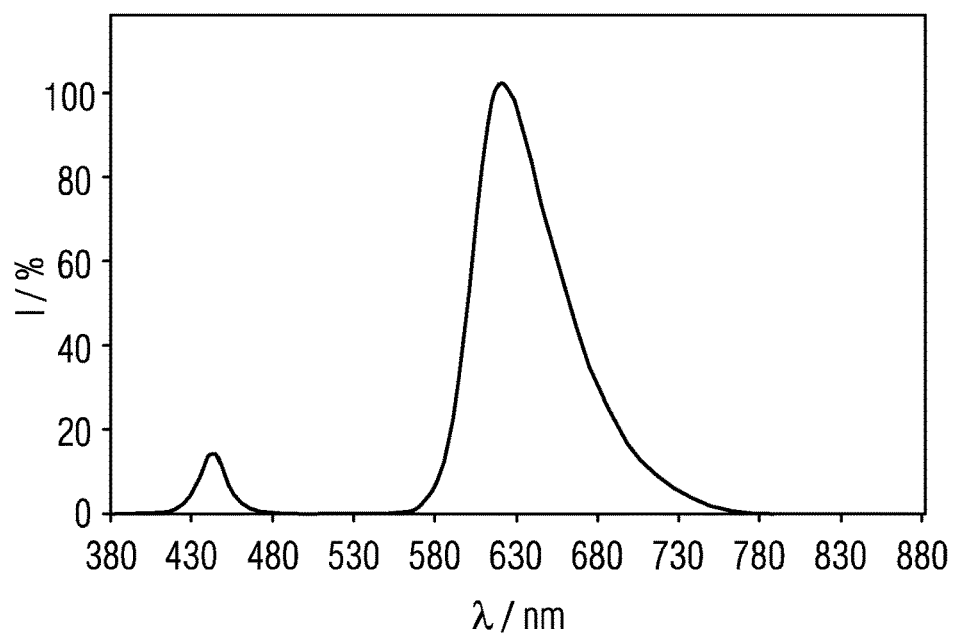
FIG. 2A depicts an emission spectrum of the total radiation of a conversion LED that has a semiconductor chip emitting a primary radiation in the blue region of the electromagnetic spectrum.
Figure 2B:
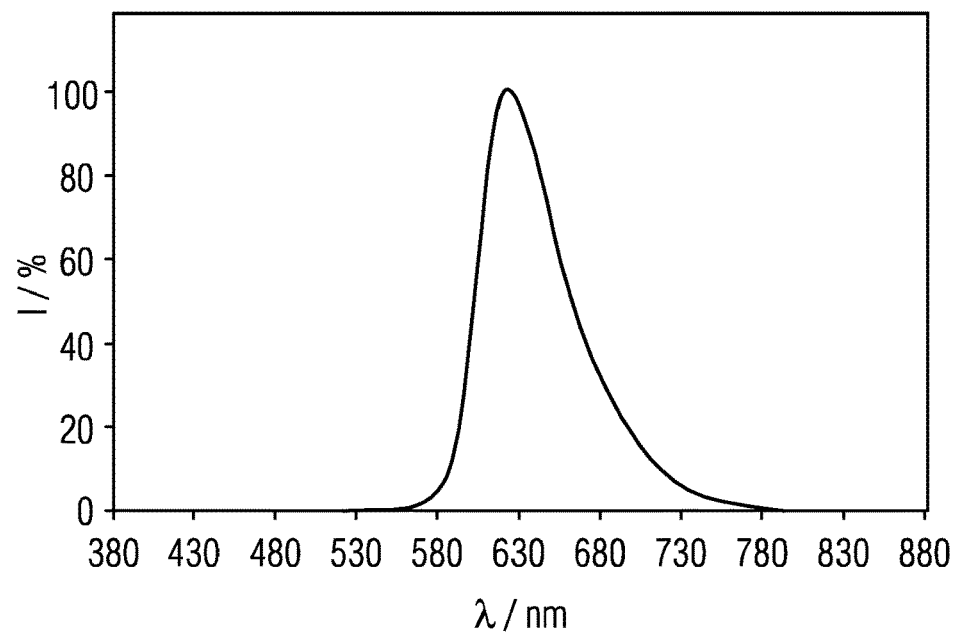
FIG. 2B depicts an emission spectrum of a total radiation emitted via a mirror or filter of the conversion LED.
Figure 2C:
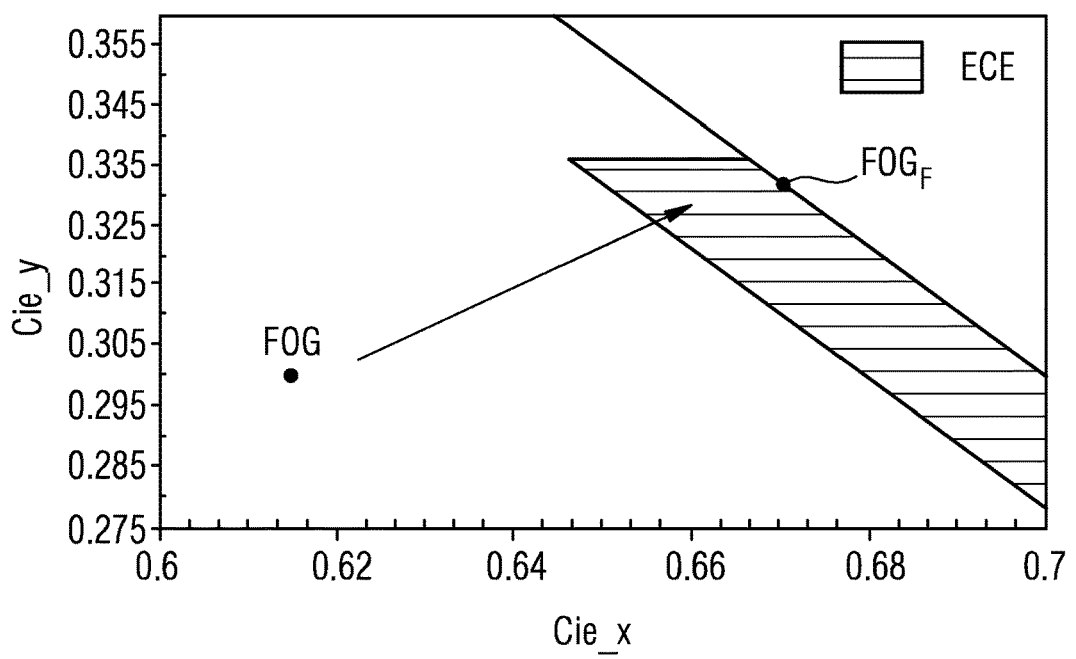
FIG. 2C depicts chromaticity coordinates of the total radiation FOG and FOGF in the CIE color space.

FIG. 2A shows an emission spectrum of the total radiation of a conversion LED, which comprises a semiconductor chip which emits a primary radiation in the blue region of the electromagnetic spectrum. In addition, the conversion LED comprises a first fluorescent material of the formula $Sr[Al_2Li_2O_2N_2]$:Eu which crystallizes in the tetragonal space group $P4_2/m$, and a second fluorescent material of the formula $Sr[Al_2Li_2O_2N_2]$:Eu, which crystallizes in the space group I4/m. The second fluorescent material is present at 5 to 10 percent by weight as a proportion of the total fluorescent material. The conversion LED contains no other fluorescent material in addition to the first and second fluorescent material. The first and the second fluorescent material partially convert the primary radiation into a secondary radiation in the red region of the electromagnetic spectrum, so that the total radiation corresponds to a mixed radiation consisting of secondary radiation and primary radiation. The chromaticity coordinate of the total radiation (FOG) is located in the red region of the electromagnetic spectrum, but not within the red ECE color range for automotive applications. In order to shift the chromaticity coordinate, the conversion LED comprises a filter or a mirror which is arranged over the conversion element and which is not transparent to the primary radiation, which is therefore filtered out of the mixed radiation so that the total radiation emitted to the outside corresponds to the secondary radiation. The chromaticity coordinate of the total radiation (FOG$_F$) emitted via the mirror or filter of the conversion LED lies in the red region of the electromagnetic spectrum and within the red ECE color range for automotive applications. The emission spectrum of the total radiation emitted via the mirror or the filter of the conversion LED is shown in FIG. 2B. The chromaticity coordinates of the total radiation FOG AND FOG$_F$ in the CIE color space are shown in FIG. 2C. Due to the use of the filter or mirror the chromaticity coordinate of the total radiation can be shifted into the red ECE color range while maintaining the efficiency.

Figure 3A:
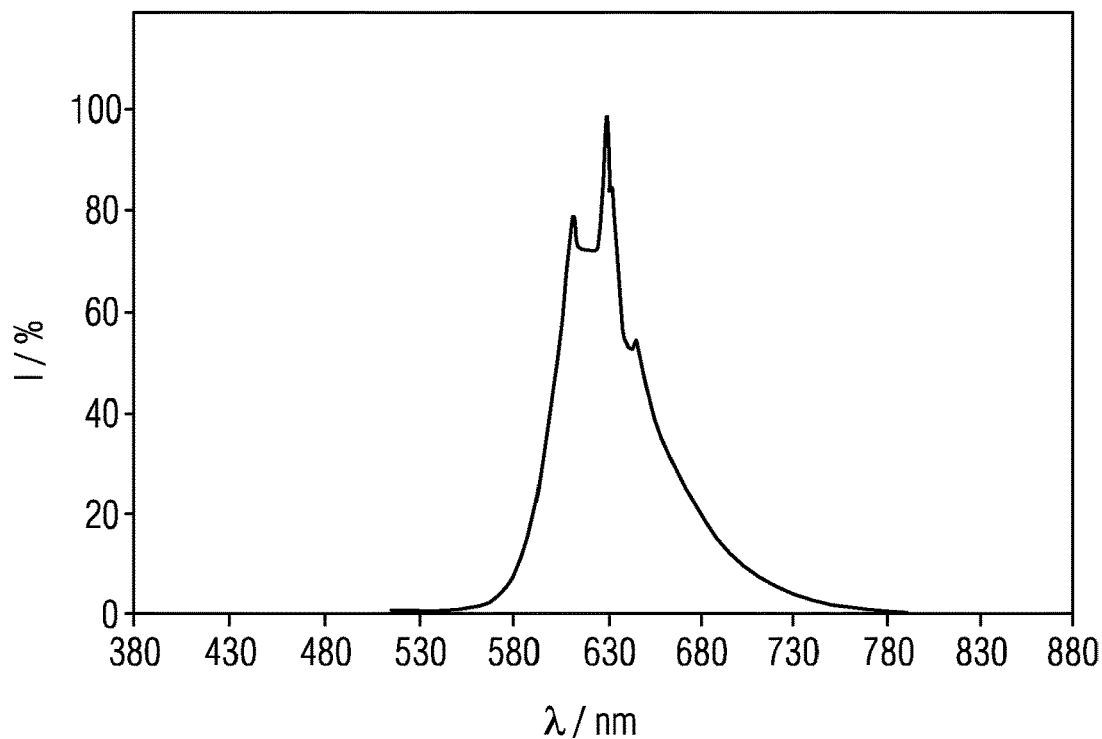
FIG. 3A shows an emission spectrum of the total radiation of a conversion LED that has a semiconductor chip emitting a primary radiation in the blue region of the electromagnetic spectrum.
Figure 3B:
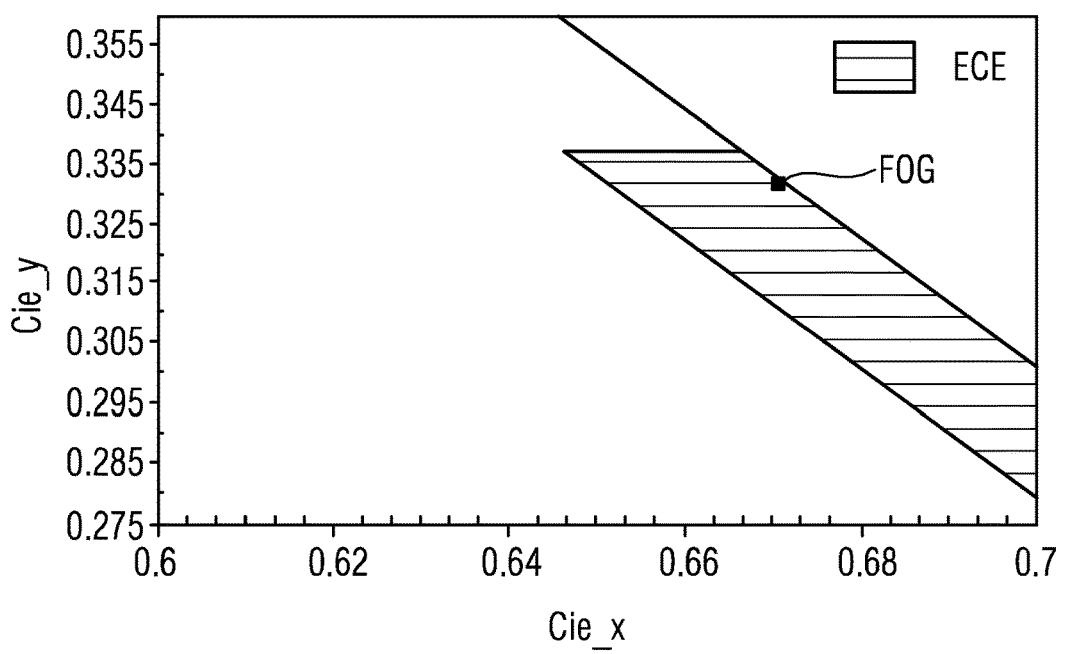
FIG. 3B depicts a chromaticity coordinate of the total radiation of the conversion LED (FOG) in the CIE color space.

FIG. 3A shows an emission spectrum of the total radiation of a conversion LED, which comprises a semiconductor chip which emits a primary radiation in the blue region of the electromagnetic spectrum. The conversion LED additionally comprises a first fluorescent material of the formula Sr[Al$_2$Li$_2$O$_2$N$_2$]:Eu, which crystallizes in the tetragonal space group P4$_2$/m, a second fluorescent material of the formula Sr[Al$_2$Li$_2$O$_2$N$_2$]:Eu, which crystallizes in the space group I4/m, and a third fluorescent material of the formula K$_2$SiF$_6$:Mn$^{4+}$. The conversion LED contains no other fluorescent material in addition to the first, the second and the third fluorescent material. The first, the second and the third fluorescent material completely convert the primary radiation into a secondary radiation in the red region of the electromagnetic spectrum, so that the secondary radiation corresponds to the total radiation of the conversion LED. The chromaticity coordinate of the total radiation is located in the red region of the electromagnetic spectrum. The chromaticity coordinate of the total radiation of the conversion LED (FOG) in the CIE color space is shown in FIG. 3B. From FIG. 3B it is apparent that the chromaticity coordinate of the total radiation of the conversion LED (FOG) lies in the red ECE color range for automotive applications (ECE-R48). Surprisingly, by combining the first, the second and the third fluorescent material a particularly high color saturation and efficiency of the total radiation can be achieved. Such a high color saturation of the total radiation cannot be achieved with the use of only one of the three fluorescent materials. Although the efficiency of the total radiation with only K$_2$SiF$_6$:Mn$^{4+}$ as the fluorescent material can be higher, on account of the low absorption capability of K$_2$SiF$_6$:Mn$^{4+}$ the use of K$_2$SiF$_6$:Mn$^{4+}$ for full conversion is not possible because this would require excessive amounts of the fluorescent material, which cannot be incorporated into conventional conversion LEDs. The chromaticity coordinate can advantageously be adjusted as required by changing the percentages by weight of the three fluorescent materials in relation to the total amount of fluorescent material. According to the current state of the art it is not possible to achieve an equivalent spectral efficiency with any other Eu-doped fluorescent material with an emission in this color range.

Figure 4A:
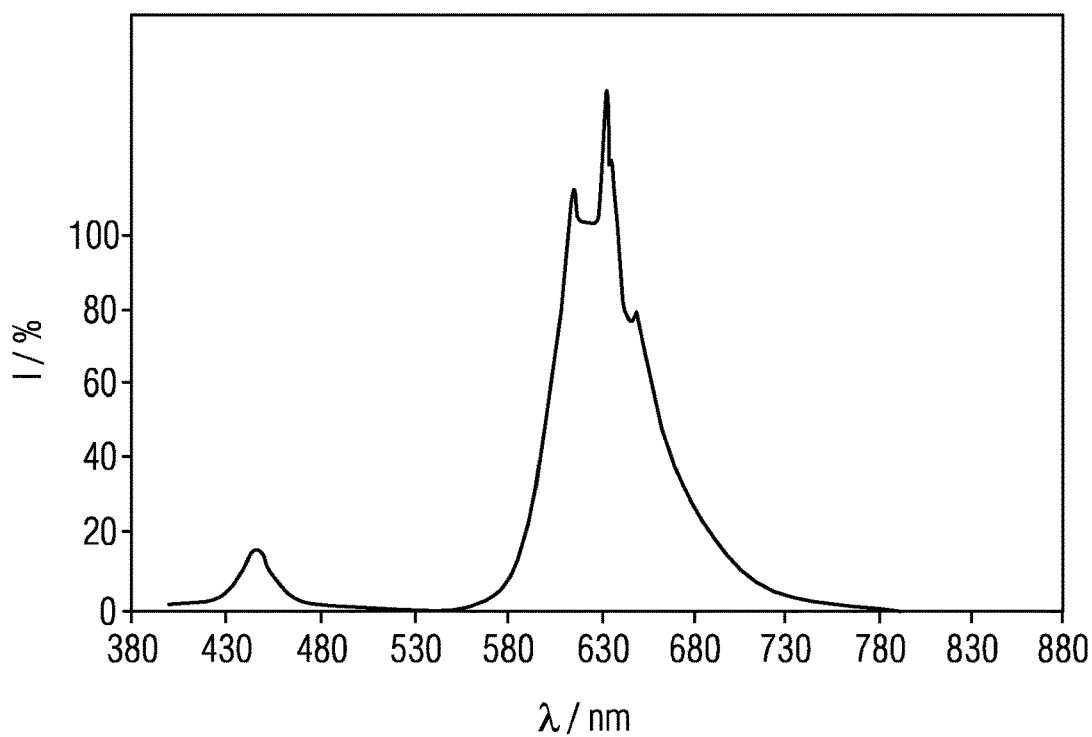
FIG. 4A shows an emission spectrum of a total radiation of a conversion LED that has a semiconductor chip that emits a primary radiation in the blue region of the electromagnetic spectrum.
Figure 4B:
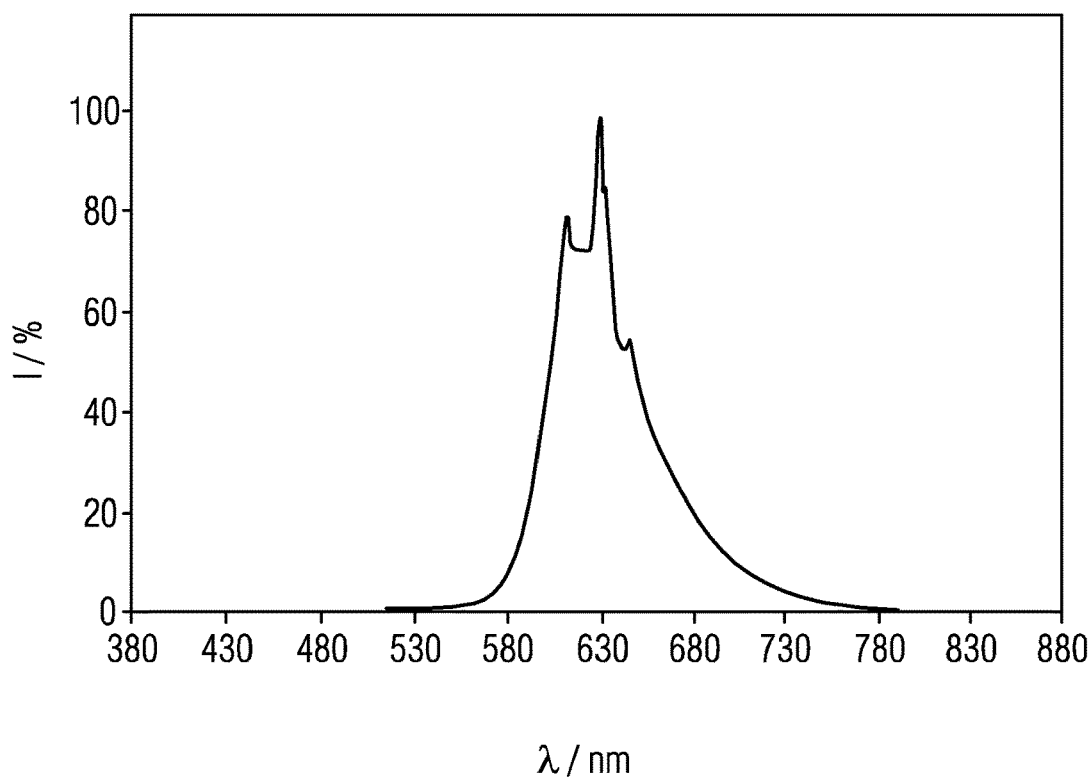
FIG. 4B depicts an emission spectrum of a total radiation emitted via a mirror or filter of the conversion LED.
Figure 4C:
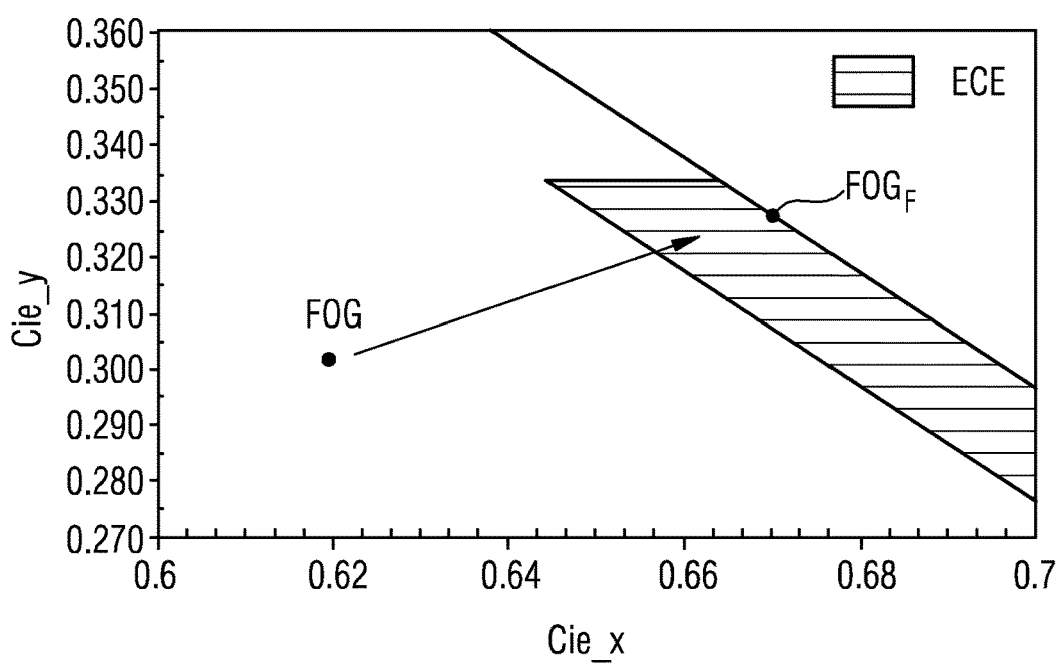
FIG. 4C depicts chromaticity coordinates of the total radiation FOG and $FOG_F$ in the CIE color space.

FIG. 4A shows an emission spectrum of the total radiation of a conversion LED, which comprises a semiconductor chip which emits a primary radiation in the blue region of the electromagnetic spectrum. The conversion LED additionally comprises a first fluorescent material of the formula Sr[Al$_2$Li$_2$O$_2$N$_2$]:Eu, which crystallizes in the tetragonal space group P4$_2$/m, a second fluorescent material of the formula Sr[Al$_2$Li$_2$O$_2$N$_2$]:Eu, which crystallizes in the space group I4/m, and a third fluorescent material of the formula K$_2$SiF$_6$:Mn$^{4+}$. The conversion LED contains no other fluorescent material in addition to the first, the second and the third fluorescent material. The first, second and third fluorescent material partially convert the primary radiation into a secondary radiation in the red region of the electromagnetic spectrum, so that the total radiation corresponds to a mixed radiation of secondary radiation and primary radiation. The chromaticity coordinate of the total radiation (FOG) is located in the red region of the electromagnetic spectrum, but not within the red ECE color range for automotive applications. In order to shift the chromaticity coordinate, the conversion LED comprises a filter or a mirror which is arranged over the conversion element and is not transparent to the primary radiation, which is therefore filtered out of the mixed radiation so that the total radiation emitted to the outside corresponds to the secondary radiation. The chromaticity coordinate of the total radiation (FOG$_F$) emitted via the mirror or filter of the conversion LED lies in the red region of the electromagnetic spectrum and within the red ECE color range for automotive applications. The emission spectrum of the total radiation emitted via the mirror or the filter of the conversion LED is shown in FIG. 4B. The chromaticity coordinates of the total radiation FOG and FOG$_F$ in the CIE color space are shown in FIG. 4C. Due to the use of the filter or mirror the chromaticity coordinate of the total radiation can be shifted into the red ECE color range while maintaining the efficiency.

Figure 5A:
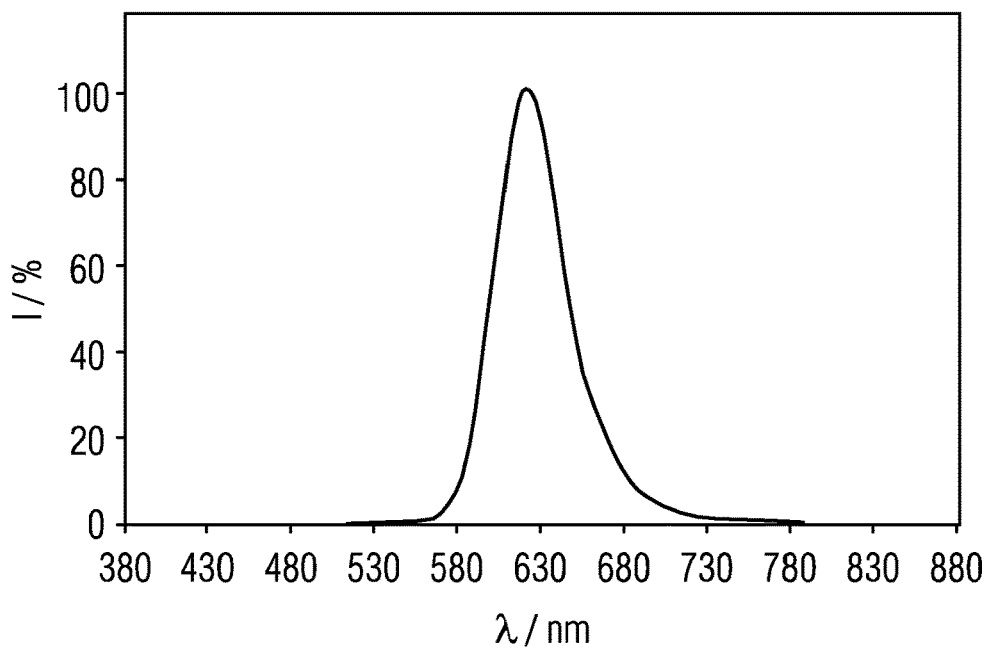
FIG. 5A shows an emission spectrum of a total radiation of a conversion LED that has a semiconductor chip that emits a primary radiation in the blue region of the electromagnetic spectrum.
Figure 5B:
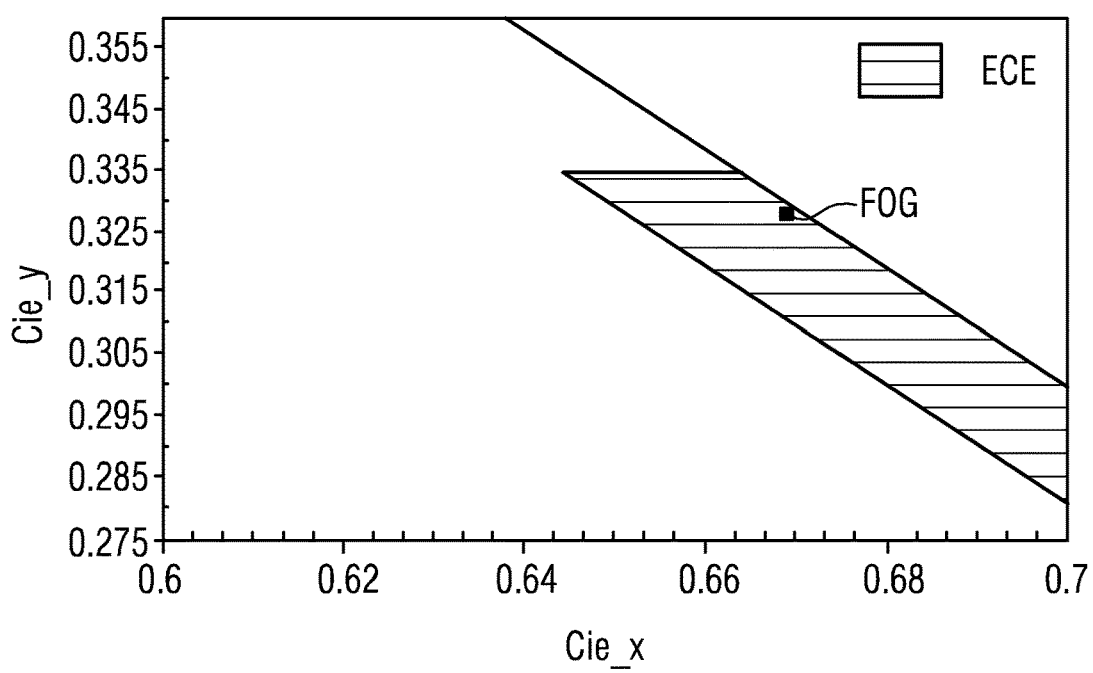
FIG. 5B depicts chromaticity coordinates of the total radiation FOG and $FOG_F$ in the CIE color space.

FIG. 5A shows an emission spectrum of the total radiation of a conversion LED, which comprises a semiconductor chip which emits a primary radiation in the blue region of the electromagnetic spectrum. Further, the conversion LED comprises a first fluorescent with the formula Sr[Al$_2$Li$_2$O$_2$N$_2$]:Eu, which crystallizes in the tetragonal space group P4$_2$/m. The conversion LED contains no other fluorescent material in addition to the first fluorescent material. The first fluorescent material completely converts the primary radiation into a secondary radiation in the red region of the electromagnetic spectrum, so that the secondary radiation corresponds to the total radiation of the conversion LED. The chromaticity coordinate of the total radiation is located in the red region of the electromagnetic spectrum. The chromaticity coordinate of the total radiation of the conversion LED (FOG) in the CIE color space is shown in FIG. 5B. It is apparent from FIG. 5B that the chromaticity coordinate of the total radiation of the conversion LED (FOG) is in the red ECE color range for automotive applications and also within the color range for the traffic-light standard EN 12368. The ECE regulation is ECE-R48.

Figure 6A:
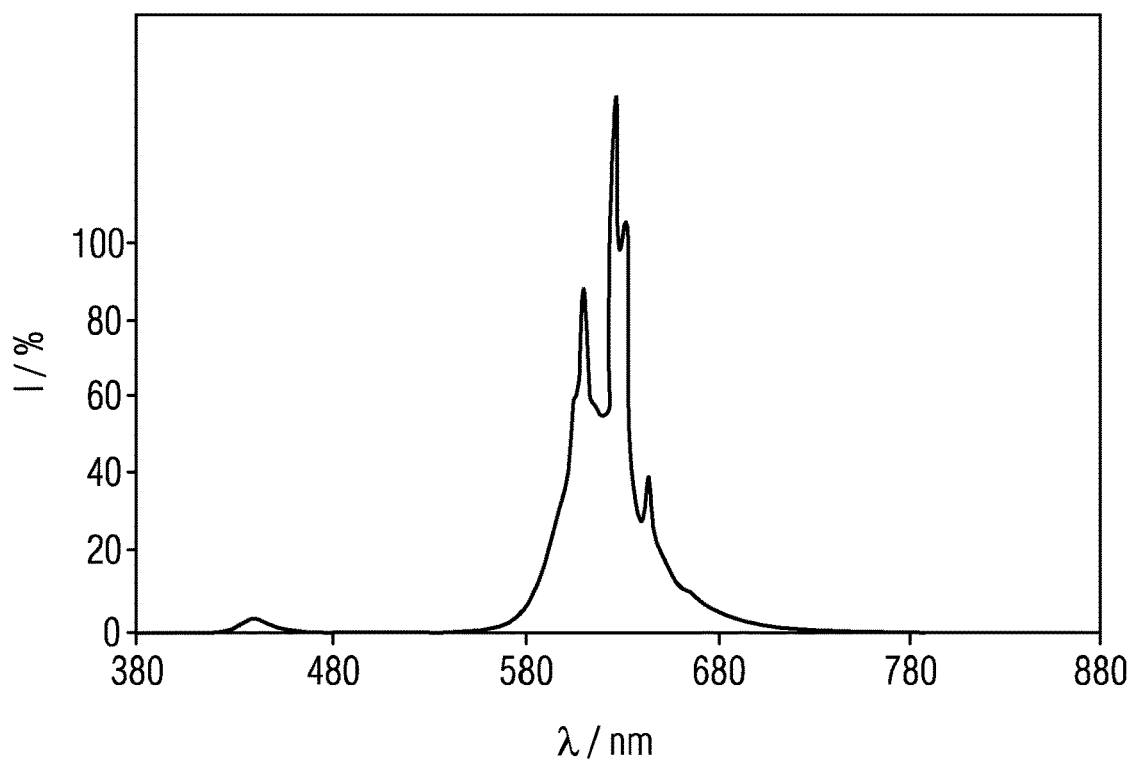
FIG. 6A shows an emission spectrum of a total radiation of a conversion LED that has a semiconductor chip that emits a primary radiation in the blue region of the electromagnetic spectrum.
Figure 6B:
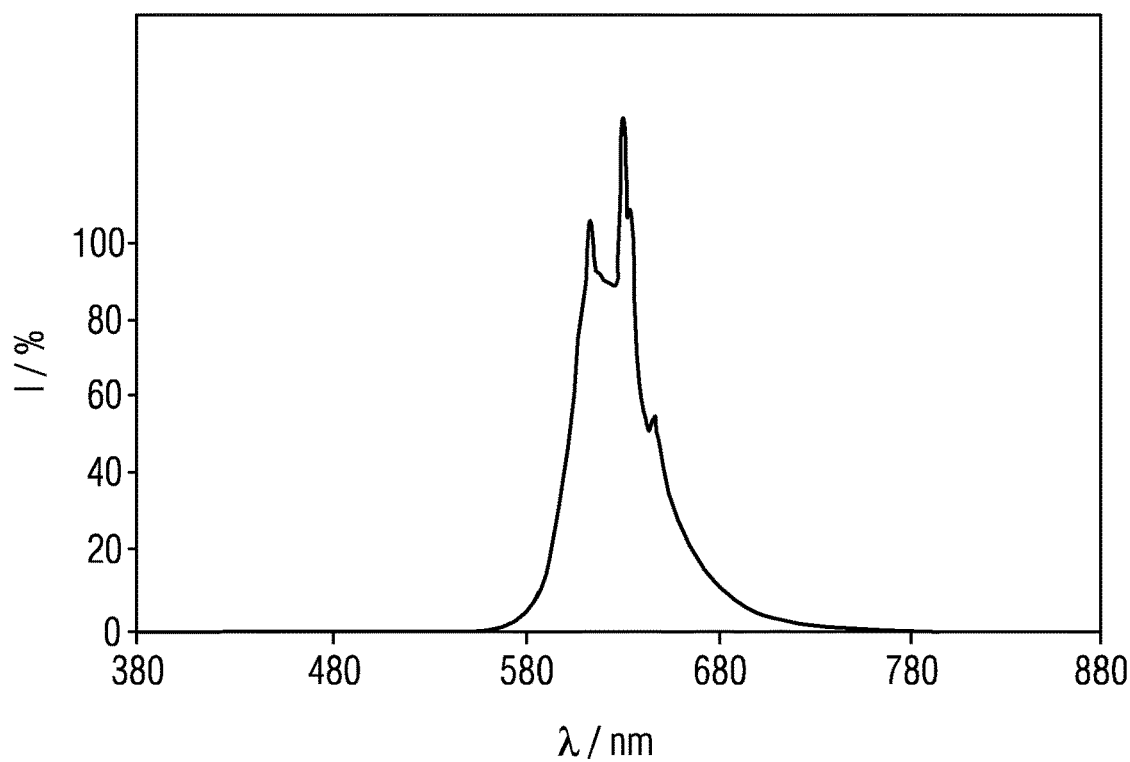
FIG. 6B depicts an emission spectrum of a total radiation emitted via a mirror or filter of the conversion LED.
Figure 6C:
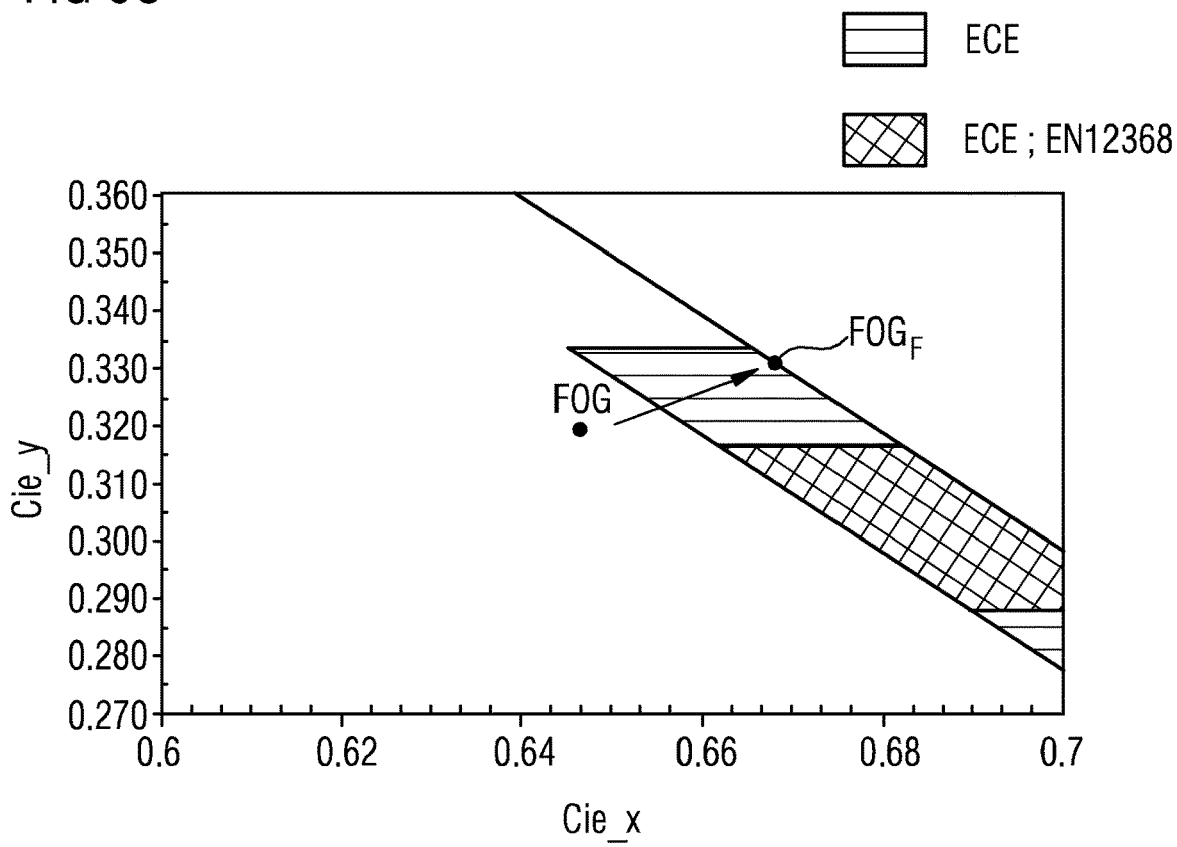
FIG. 6C depicts chromaticity coordinates of the total radiation FOG and $FOG_F$ in the CIE color space.

FIG. 6A shows an emission spectrum of the total radiation of a conversion LED, which comprises a semiconductor chip which emits a primary radiation in the blue region of the electromagnetic spectrum. In addition, the conversion LED comprises a first fluorescent material of the formula Sr[Al$_2$Li$_2$O$_2$N$_2$]:Eu, which crystallizes in the tetragonal space group P4$_2$/m, and a second fluorescent material of the formula K$_2$SiF$_6$:Mn$^{4+}$. The conversion LED contains no other fluorescent material in addition to the first and second fluorescent material. The first and the second fluorescent material partially convert the primary radiation into a secondary radiation in the red region of the electromagnetic spectrum, so that the total radiation corresponds to a mixed radiation consisting of secondary radiation and primary radiation. The chromaticity coordinate of the total radiation (FOG) is located in the red region of the electromagnetic spectrum, but not within the red ECE color range for automotive applications. In order to shift the chromaticity coordinate, the conversion LED comprises a filter or a mirror which is arranged over the conversion element and which is not transparent to the primary radiation, which is therefore filtered out of the mixed radiation so that the total radiation emitted to the outside corresponds to the secondary radiation. The chromaticity coordinate of the total radiation (FOG$_F$) emitted via the mirror or filter of the conversion LED lies in the red region of the electromagnetic spectrum and within the red ECE color range for automotive applications. The emission spectrum of the total radiation emitted via the mirror or the filter of the conversion LED is shown in FIG. 6B. The chromaticity coordinates of the total radiation FOG and FOG$_F$ in the CIE color space are shown in FIG. 6C. Due to the use of the filter or mirror the chromaticity coordinate of the total radiation can be shifted into the red ECE color range while maintaining the efficiency.

Figure 7A:
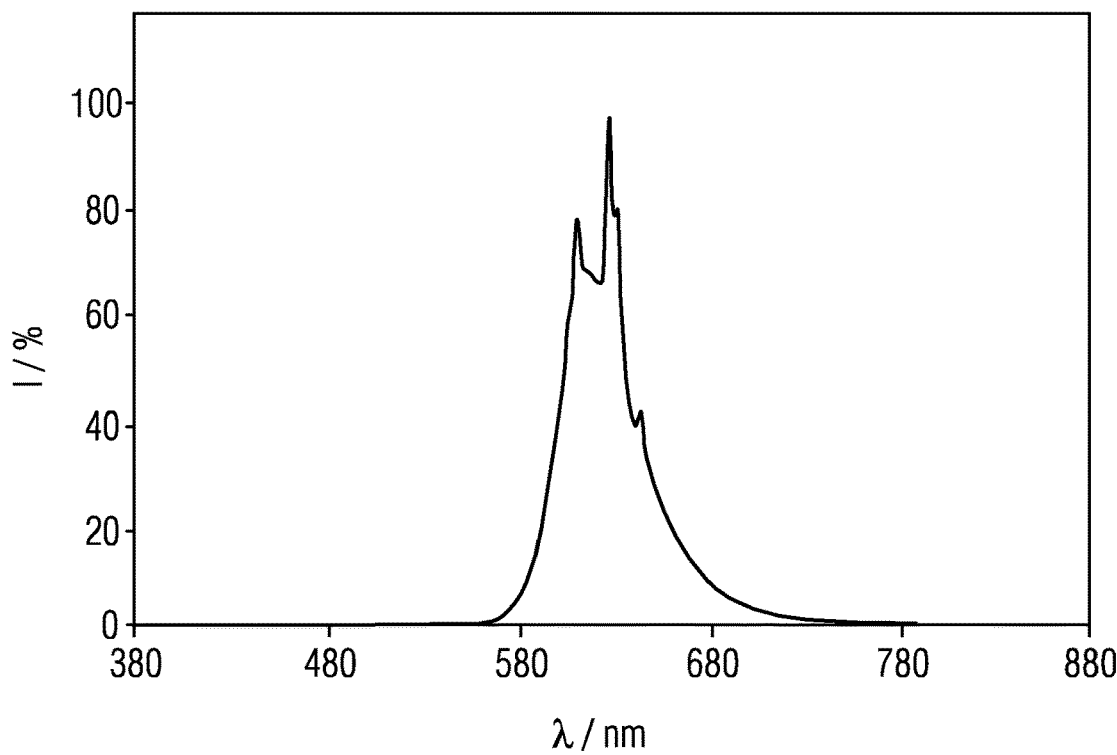
FIG. 7A shows an emission spectrum of a total radiation of a conversion LED that has a semiconductor chip that emits a primary radiation in the blue region of the electromagnetic spectrum.
Figure 7B:
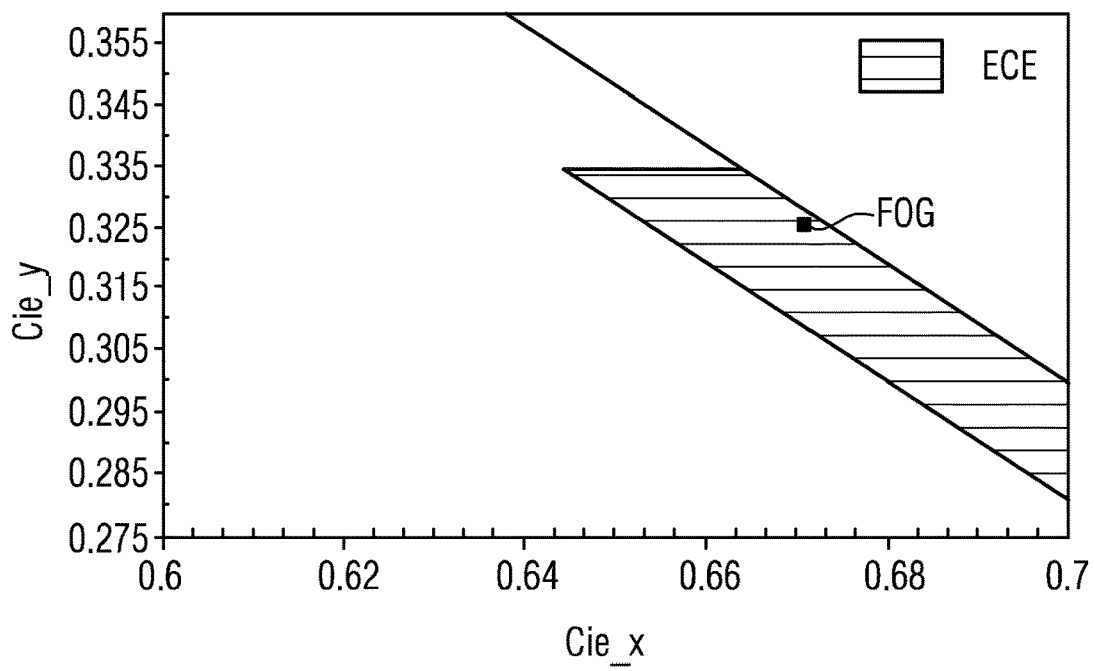
FIG. 7B depicts chromaticity coordinates of the total radiation FOG and $FOG_F$ in the CIE color space.

FIG. 7A shows an emission spectrum of the total radiation of a conversion LED, which comprises a semiconductor chip which emits a primary radiation in the blue region of the electromagnetic spectrum. In addition, the conversion LED comprises a first fluorescent material of the formula Sr[Al$_2$Li$_2$O$_2$N$_2$]:Eu, which crystallizes in the tetragonal space group P4$_2$/m, and a second fluorescent material of the formula K$_2$SiF$_6$:Mn$^{4+}$. The conversion LED contains no other fluorescent material in addition to the first and second fluorescent material. The first and the second fluorescent material completely convert the primary radiation into a secondary radiation in the red region of the electromagnetic spectrum, so that the secondary radiation corresponds to the total radiation of the conversion LED. The larger component of the total radiation in this embodiment is that of the secondary radiation from the first fluorescent material Sr[Al$_2$Li$_2$O$_2$N$_2$]:Eu. The chromaticity coordinate of the total radiation is located in the red region of the electromagnetic spectrum. The chromaticity coordinate of the total radiation of the conversion LED (FOG) in the CIE color space is shown in FIG. 7B. From FIG. 7B, it is clear that the chromaticity coordinate of the total radiation of the conversion LED (FOG) lies in the red ECE color range for automotive applications. Surprisingly, by combining the first and second fluorescent material a particularly high color saturation and efficiency of the total radiation can be achieved. Such a high color saturation and efficiency of the total radiation cannot be achieved with the use of only one of the two fluorescent materials. The chromaticity coordinate can be advantageously adjusted as required by changing the percentages by weight of the two fluorescent materials in relation to the total amount of fluorescent material. According to the current state of the art it is not possible to achieve an equivalent spectral efficiency with any other Eu-doped fluorescent material with an emission in this color range.

Figure 8A:
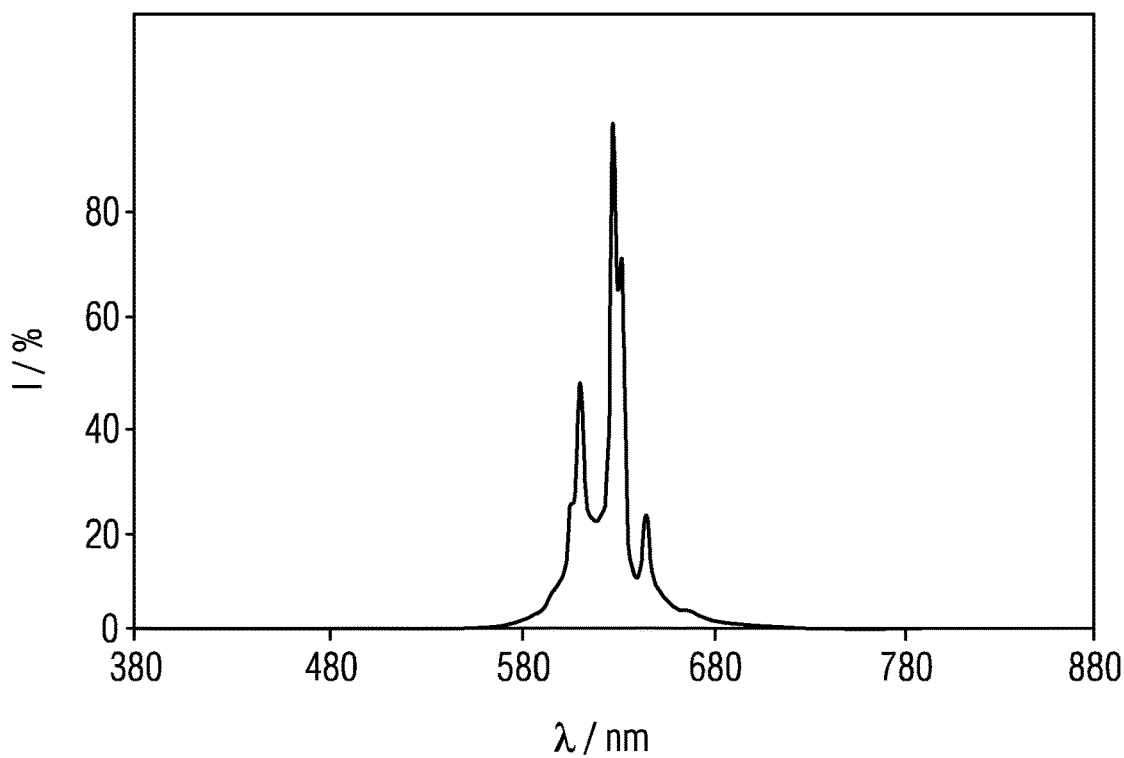
FIG. 8A shows an emission spectrum of a total radiation of a conversion LED that has a semiconductor chip that emits a primary radiation in the blue region of the electromagnetic spectrum.
Figure 8B:
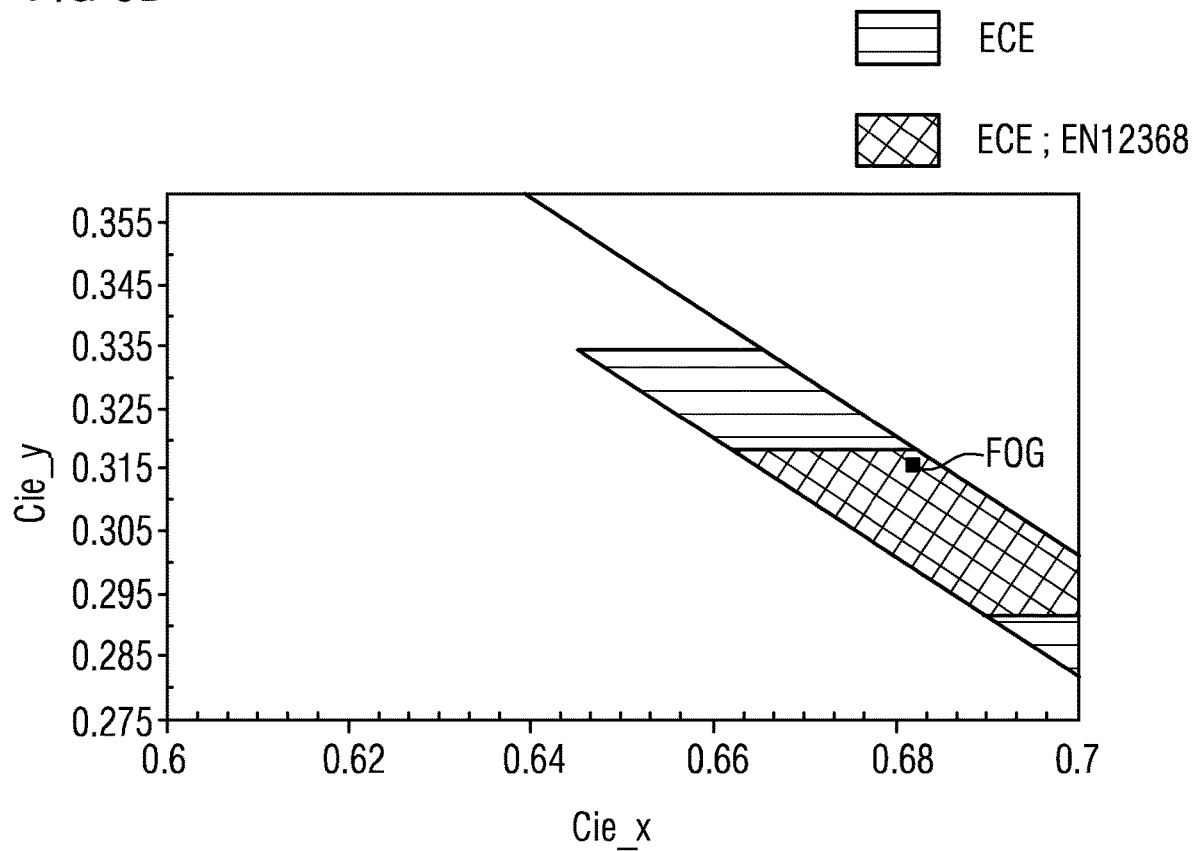
FIG. 8B depicts chromaticity coordinates of the total radiation FOG and $FOG_F$ in the CIE color space.

FIG. 8A shows an emission spectrum of the total radiation of a conversion LED, which comprises a semiconductor chip which emits a primary radiation in the blue region of the electromagnetic spectrum. In addition, the conversion LED comprises a first fluorescent material of the formula Sr[Al$_2$Li$_2$O$_2$N$_2$]:Eu, which crystallizes in the tetragonal space group P4$_2$/m, and a second fluorescent material of the formula K$_2$SiF$_6$:Mn$^{4+}$. The conversion LED contains no other fluorescent material in addition to the first and second fluorescent material. The first and the second fluorescent material completely convert the primary radiation into a secondary radiation in the red region of the electromagnetic spectrum, so that the secondary radiation corresponds to the total radiation of the conversion LED. The major component of the total radiation in this embodiment is that of the secondary radiation of the second fluorescent material K$_2$SiF$_6$:Mn$^{4+}$. The chromaticity coordinate of the total radiation is located in the red region of the electromagnetic spectrum. The chromaticity coordinate of the total radiation of the conversion LED (FOG) in the CIE color space is shown in FIG. 8B. It is apparent from FIG. 8B that the chromaticity coordinate of the total radiation of the conversion LED (FOG) lies in the red ECE color range for automotive applications and also within the color range for the traffic-light standard EN 12368. Surprisingly, by combining the first and second fluorescent material a particularly high color saturation and efficiency of the total radiation can be achieved. Such a high color saturation and efficiency of the total radiation cannot be achieved with the use of only one of the two fluorescent materials. The chromaticity coordinate can advantageously be adjusted as required by changing the percentage by weight of the two fluorescent materials in relation to the total amount of fluorescent material.

Figure 9:
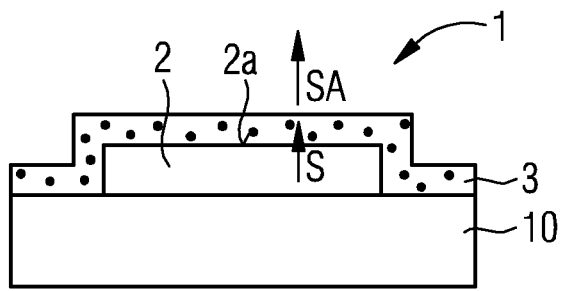
FIGS. 9 to 11 depict schematic side view of various non-limiting embodiments of lighting devices.
Figure 10:
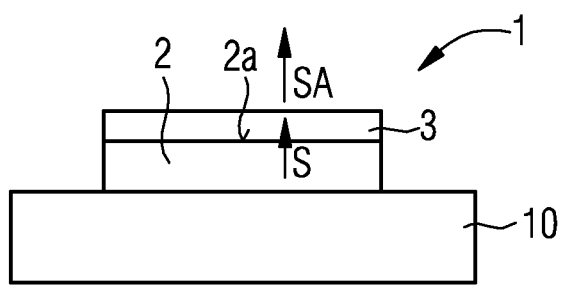
Figure 11:
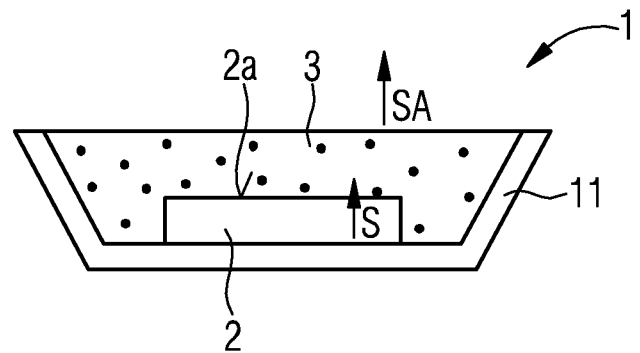

The FIGS. 9 to 11 each show schematic side views of different embodiments of lighting devices, in particular conversion LEDs, described here.

The conversion LEDs of FIGS. 9 to 11 have at least one first fluorescent material of the formula Sr[Al$_2$Li$_2$O$_2$N$_2$]:Eu, which crystallizes in the tetragonal space group P4$_2$/m. In addition, a second or a second and a third fluorescent material can be provided.

The conversion LED according to FIG. 9 has a semiconductor layer sequence 2 which is arranged on a substrate 10. The substrate 10 can be designed, for example, to be reflecting. Over the semiconductor layer sequence 2 a conversion element 3 in the form of a layer is arranged. The semiconductor layer sequence 2 has an active layer (not shown), which in the operation of the conversion LED emits a primary radiation with a wavelength of 300 nm to 500 nm. The conversion element 3 is arranged in the beam path of the primary radiation S. The conversion element 3 comprises a matrix material, such as a silicone, and particles of the first and second fluorescent material or particles of the first, the second and the third fluorescent material. Alternatively or in addition to the second or the second and third fluorescent material, a filter or a mirror (not shown here) may be arranged over the conversion element, which is configured to filter the primary radiation so that no primary radiation escapes from the filter or mirror.

For example, the first or the first and the second or the first, the second and the third fluorescent material has/have a mean grain size of 10 μm. The fluorescent materials are capable of partially or completely converting the primary radiation S into a secondary radiation SA in the red spectral range in the operation of the conversion LED. The first, or the first and the second or the first, second and third fluorescent material are homogeneously distributed in the conversion element 3 in the matrix material, within the manufacturing tolerance.

Alternatively, the fluorescent materials can also be distributed in the matrix material with a concentration gradient.

Alternatively, the matrix material can also be absent, so that the first or the first and the second or the first, second and third fluorescent material 4 is/are formed as a ceramic converter.

The conversion element 3 is applied over the whole of the radiation-emitting surface 2a of the semiconductor layer sequence 2 and of the lateral surfaces of the semiconductor layer sequence 2 and is in direct mechanical contact with the radiation-emitting surface 2a of the semiconductor layer sequence 2 and the lateral surfaces of the semiconductor layer sequence 2. The primary radiation S can also emerge via the lateral surfaces of the semiconductor layer sequence 2.

The conversion element 3 can be applied, for example, by injection molding, injection pressing or by spray coating processes. In addition, the conversion LED has electrical contacts (not shown here), the design and arrangement of which is known to the person skilled in the art.

Alternatively, the conversion element can also be prefabricated and applied to the semiconductor layer sequence 2 by means of a so-called pick-and-place process.

FIG. 10 shows a further exemplary embodiment of a conversion LED 1. The conversion LED 1 has a semiconductor layer sequence 2 on a substrate 10. The conversion element 3 is formed on the semiconductor layer sequence 2. The conversion element 3 is formed as a platelet. The platelet can consist of sintered together particles of the first fluorescent material, of the first and second fluorescent material, or of the first, the second and the third fluorescent material and can thus be a ceramic platelet, or the platelet comprises, for example, glass, silicone, as the matrix material with embedded particles of the first fluorescent material or the fluorescent materials. If the conversion element 3 consists of co-sintered particles of the first fluorescent material, this is configured to convert the primary radiation only partially into a red secondary radiation and over the conversion element 3 a mirror or filter (not shown) is arranged, which is configured to filter the primary radiation so that no or only a minimal primary radiation escapes from the filter or mirror.

The conversion element 3 is applied over the whole of the radiation-emitting surface 2a of the semiconductor layer sequence 2. In particular, no primary radiation S emerges through the lateral surfaces of the semiconductor layer sequence 2, but virtually all through the radiation-emitting surface 2a. The conversion element 3 can be applied to the semiconductor layer sequence 2 by means of an adhesive layer (not shown), for example of silicone.

The conversion LED 1 in accordance with FIG. 11 has a housing 11 with a recess. In the recess a semiconductor layer sequence 2 is arranged, which has an active layer (not shown). In the operation of the conversion LED the active layer emits a primary radiation S with a wavelength of 300 nm to 460 nm.

The conversion element 3 is formed as an encapsulation of the layer sequence in the recess and comprises a matrix material such as a silicone, and a first fluorescent material, a first and second fluorescent material, or a first, a second and a third fluorescent material. The first fluorescent material or the fluorescent materials at least partially convert the primary radiation S into a secondary radiation SA in the operation of the conversion LED 1. In the case of a partial conversion a filter or a mirror (not shown) is arranged over the conversion element 3. Alternatively, the fluorescent materials completely convert the primary radiation S into secondary radiation SA. If the conversion element 3 contains only the first fluorescent material, this is configured to convert the primary radiation only partially into a red secondary radiation, and over the conversion element 3 a mirror or filter (not shown) is arranged, which is configured to filter the primary radiation so that no primary radiation escapes from the filter or mirror.

It is also possible that the first fluorescent material or fluorescent materials in the exemplary embodiments of FIGS. 9 to 11 is/are arranged in the conversion element 3 spatially separated from the semiconductor layer sequence 2 or the radiation-emitting surface 2a. This can be achieved, for example, by sedimentation or by applying the conversion layer to the housing.

For example, in contrast to the embodiment of FIG. 11, the encapsulation can be formed solely from a matrix material such as silicone, wherein the conversion element 3 is applied on the encapsulation, spaced apart from the semiconductor layer sequence 2, as a layer on the housing 11 and on the potting compound.

The exemplary embodiments and their individual features described in connection with the figures can in accordance with other exemplary embodiments also be combined with each other, even if such combinations are not explicitly shown in the figures. In addition, the exemplary embodiments described in connection with the Figures can also comprise additional or alternative features in accordance with the general section of the description.

The invention is not limited to the embodiments by the fact that the description is based on them. Rather, the invention comprises each new feature, as well as any combination of features, which includes in particular every combination of features in the patent claims, even if this feature or this combination itself is not explicitly specified in the patent claims or exemplary embodiments.

LIST OF REFERENCE SIGNS 1 lighting device or conversion LED
2 semiconductor layer sequence or semiconductor chip
2a radiation-emitting surface
3 conversion element
10 substrate
11 housing
S primary radiation
SA secondary radiation
LED light-emitting diode
FOG chromaticity coordinate of the total radiation
$FOG_F$ chromaticity coordinate of the total radiation filtered

The invention claimed is:
1. A lighting device for emitting a red total radiation, wherein the lighting device comprises:
a semiconductor layer sequence configured to emit electromagnetic primary radiation;
a conversion element comprising a first fluorescent material of the formula $Sr[Al_2Li_2O_2N_2]$:Eu, crystallized in the tetragonal space group $P4_2/m$, wherein the first fluorescent material at least partially converts the electromagnetic primary radiation into an electromagnetic secondary radiation in the red region of the electromagnetic spectrum, wherein:
the conversion element comprises a second fluorescent material configured to at least partially convert the electromagnetic primary radiation into an electromagnetic secondary radiation in the red region of the electromagnetic spectrum; and/or
the lighting device comprises a mirror or filter arranged over the conversion element.

2. The lighting device as claimed in claim 1, wherein the second fluorescent material has the general formula:

$$M_{(1-0.5z)}Z_z[A_aB_bC_cD_dE_eN_{4-n}O_n]:ES_x,RE_y, \text{ wherein:}$$

M=Ca, Sr, Ba, or combinations thereof;
Z=Na, K, Rb, Cs, Ag, or combinations thereof;
A=Mg, Mn, Zn, or combinations thereof;
B=B, Al, Ga, or combinations thereof;
C=Si, Ge, Ti, Zr, Hf, or combinations thereof;
D=Li, Cu, or combinations thereof;
E=P, V, Nb, Ta, or combinations thereof;
ES=Ce$^{3+}$;
RE=Eu$^{2+}$, Eu$^{3+}$, Yb$^{2+}$, Yb$^{3+}$, or combinations thereof; and
$0 \leq x \leq 0.2$; $0 \leq y \leq 0.2$; $0 \leq x+y \leq 0.2$; $0 \leq z \leq 0.9$ or $0 \leq z \leq 0.5$; $0 \leq n \leq 4$; $0 \leq a \leq 4$; $0 \leq b \leq 4$; $0 \leq c \leq 4$; $0 \leq d \leq 4$; $0 \leq e \leq 4$; $a+b+c+d+e=4$ and $2a+3b+4c+d+5E=10-n+Z$.

3. The lighting device as claimed in claim 2, wherein the second fluorescent material has the general formula $M_{(1-y)}[B_bD_dN_{4-n}O_n]:RE_y$, wherein:

M=Ca, Sr, Ba, or combinations thereof;
B=B, Al, Ga, or combinations thereof;
D=Li, Cu, or combinations thereof;
RE=Eu$^{2+}$; and
$0<y \leq 0.2$; $0 \leq n \leq 4$; $0 \leq b \leq 4$; $0 \leq d \leq 4$ and $b+d=4$.

4. The lighting device as claimed in claim 2, wherein the second fluorescent material crystallizes in the space group I4/m.

5. The lighting device as claimed in claim 4, wherein the second fluorescent material has the formula Sr[Al$_2$Li$_2$O$_2$N$_2$]:Eu.

6. The lighting device as claimed in claim 1, wherein the second fluorescent material has the general formula:

$$M^*_{x^*}A^*_{y^*}[B^*_{z^*}C^*_{f^*}D^*_{g^*}E^*_{h^*}O_{a^*}F_{b^*}]:Mn^{4+}, \text{ wherein:}$$

A*=Li, Na, K, Rb, Cs, Cu, Ag, NH$_4$, or combinations thereof;
M*=Be, Mg, Ca, Ba, Sr, Zn, Sn, or combinations thereof;
B*=Si, Ge, Sn, Ti, Zr, Hf, or combinations thereof;
C*=Al, Ga, In, Gd, Y, Sc, La, Tb, Bi, Cr, or combinations thereof;
D*=Nb, Ta, V, or combinations thereof;
E*=W, Mo, or combinations thereof;
$2x+y=-(4z+3f+5g+6h+4c-2+a-b)$; and
$0 \leq x^*$; $0 \leq y^*$; $0 \leq z^*$; $0 \leq f^*$; $0 \leq g^*$; $0 \leq h^*$; $0 \leq a^*$; $0 \leq b^*$; $x^*+y^*+z^*+f^*+g^*+h^*>0$ and $a^*+b^*>0$.

7. The lighting device as claimed in claim 6, wherein the second fluorescent material has the general formula A*$_2$B*F$_6$:Mn$^{+4}$, wherein:
A*=Li, Na, K, Rb, Cs, Cu, Ag, NH$_4$, or combinations thereof; and
B*=Si, Ge, Sn, Ti, Zr, Hf, or combinations thereof.

8. The lighting device as claimed in claim 1, wherein the second fluorescent material has the general formula $$(4-x)MgO.xMgF_2.GeO_2:Mn^{4+}, A_2Ge_4O_9:Mn^{4+} \text{ or } A_3A'Ge_8O_{18}:Mn^{4+} \text{ wherein:}$$

A=Li, K, Na, or Rb; and
A'=Li, K, Na, or Rb.

9. The lighting device as claimed in claim 1, wherein the second fluorescent material is selected from Sr$_4$Al$_{14}$O$_{25}$:Mn$^{4+}$, Mg$_2$TiO$_4$:Mn$^{4+}$, CaZrO$_3$:Mn$^{4+}$, Gd$_3$Ga$_5$O$_{12}$:Mn$^{4+}$, Al$_2$O$_3$:Mn$^{4+}$, GdAlO$_3$:Mn$^{4+}$, LaAlO$_3$:Mn$^{4+}$, LiAl$_5$O$_8$:Mn$^{4+}$, SrTiO$_3$:Mn$^{4+}$, Y$_2$Ti$_2$O$_7$:Mn$^{4+}$, Y$_2$Sn$_2$O$_7$:Mn$^{4+}$, CaAl$_{12}$O$_{19}$:Mn$^{4+}$, MgO:Mn$^{4+}$, Ba$_2$LaNbO$_6$:Mn$^{4+}$, or combinations thereof.

10. The lighting device as claimed in claim 1, wherein the second fluorescent material comprises quantum dots having a semiconducting material.

11. The lighting device as claimed in claim 10, wherein the semiconducting material is selected from CdS, CdSe, CdTe, ZnS, ZnTe, HgTe, HgSe, GaP, GaAs, GaSb, AlP, AlAs, AlSb, InP, InAs, InSb, SiC, InN, AlN, and combinations thereof.

12. The lighting device as claimed in claim 1, wherein the second fluorescent material is selected from semiconductor perovskites of the general formula ZMX$_3$ wherein:
Z=Cs, CH$_3$NH$_3$, CH(NH$_2$)$_2$, (CH$_3$)$_3$NH, or combinations thereof;
M=Pb, Sn, Ge, Mn, Cd, Zn, or combinations thereof; and
X=Br, I, SCN, or combinations thereof; or
the general formula A$^I_2$M$^{II}$M$^{III}$X$_6$ wherein:
A$^I$=Cs, CH$_3$NH$_3$, CH(NH$_2$)$_2$, (CH$_3$)$_3$NH, or combinations thereof;
M$^I$=Ag, K, Tl, Au, or combinations thereof;
M$^{III}$=Sb, Bi, As, Sn, or combinations thereof; and
X=Br, I, SCN, or combinations thereof.

13. The lighting device as claimed in claim 2, wherein the conversion element further comprises a third fluorescent material, wherein the third fluorescent material at least partially converts the electromagnetic primary radiation into electromagnetic secondary radiation in the red region of the electromagnetic spectrum and has the general formula $$M^*_{x^*}A^*_{y^*}[B^*_{z^*}C^*_{f^*}D^*_{g^*}E^*_{h^*}O_{a^*}F_{b^*}]:Mn^{4+}, \text{ wherein:}$$

A*=Li, Na, K, Rb, Cs, Cu, Ag, NH$_4$, or combinations thereof;
M*=Be, Mg, Ca, Ba, Sr, Zn, Sn, or combinations thereof;
B*=Si, Ge, Sn, Ti, Zr, Hf, or combinations thereof;
C*=Al, Ga, In, Gd, Y, Sc, La, Tb, Bi, Cr, or combinations thereof;
D*=Nb, Ta, V, or combinations thereof;
E*=W, Mo, or combinations thereof;
$2x+y=-(4z+3f+5g+6h+4c-2+a-b)$;
$0 \leq x^*$; $0 \leq y^*$; $0 \leq z^*$; $0 \leq f^*$; $0 \leq g^*$; $0 \leq h^*$; $0 \leq a^*$; $0 \leq b^*$; $x^*+y^*+z^*+f^*+g^*+h^*>0$ and $a^*+b^*>0$.

14. A lamp for a motor vehicle comprising the lighting device as claimed in claim 1.

15. A lamp for a traffic light comprising the lighting device as claimed in claim 1.

* * * * *

UNITED STATES PATENT AND TRADEMARK OFFICE
CERTIFICATE OF CORRECTION

PATENT NO. : 11,447,695 B2
APPLICATION NO. : 16/762511
DATED : September 20, 2022
INVENTOR(S) : Ion Stoll et al.

It is certified that error appears in the above-identified patent and that said Letters Patent is hereby corrected as shown below:

On the Title Page

Please include European PCT application number PCT/EP2017/078913 as Foreign Application Priority Data.

Signed and Sealed this
Thirty-first Day of January, 2023

Katherine Kelly Vidal
*Director of the United States Patent and Trademark Office*